(12) United States Patent
Lin et al.

(10) Patent No.: US 12,426,311 B1
(45) Date of Patent: Sep. 23, 2025

(54) GATE STRUCTURES AND SPACERS IN SEMICONDUCTOR DEVICES AND METHODS OF MANUFACTURING THEREOF

(71) Applicant: Taiwan Semiconductor Manufacturing Company Limited, Hsinchu (TW)

(72) Inventors: Shih-Yao Lin, New Taipei (TW); Kuei-Yu Kao, Hsinchu (TW); Chen-Ping Chen, Yilan County (TW); Chih-Chung Chiu, Hsinchu (TW); Chih-Han Lin, Hsinchu (TW); Ming-Ching Chang, Hsinchu (TW); Chao-Cheng Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/733,564

(22) Filed: Jun. 4, 2024

Related U.S. Application Data

(62) Division of application No. 17/371,907, filed on Jul. 9, 2021, now Pat. No. 12,034,056.

(51) Int. Cl.
| | |
|---|---|
| *H10D 30/00* | (2025.01) |
| *H10D 30/01* | (2025.01) |
| *H10D 30/43* | (2025.01) |
| *H10D 30/67* | (2025.01) |
| *H10D 62/10* | (2025.01) |

(Continued)

(52) U.S. Cl.
CPC ....... *H10D 30/6735* (2025.01); *H10D 30/014* (2025.01); *H10D 30/43* (2025.01); *H10D 30/6757* (2025.01); *H10D 62/121* (2025.01); *H10D 62/151* (2025.01); *H10D 64/017* (2025.01); *H10D 64/018* (2025.01); *H10D 84/013* (2025.01); *H10D 84/038* (2025.01); *H10D 84/83* (2025.01)

(58) Field of Classification Search
CPC .......... H10D 30/0195; H10D 30/0196; H10D 30/0197; H10D 30/019; H10D 30/501; H10D 30/507; H10D 30/508; H10D 30/6735; H10D 62/121; H10D 64/017; H10D 64/018; H10D 64/021
See application file for complete search history.

(56) References Cited

U.S. PATENT DOCUMENTS

| | | |
|---|---|---|
| 10,797,163 B1 | 10/2020 | Yu et al. |
| 2020/0044061 A1 | 2/2020 | Cheng et al. |
| 2020/0381251 A1 | 12/2020 | Kim et al. |

OTHER PUBLICATIONS

Non-Final Office Action on U.S. Appl. No. 17/371,907 Dtd Sep. 11, 2023.

(Continued)

*Primary Examiner* — Reema Patel
(74) *Attorney, Agent, or Firm* — FOLEY & LARDNER LLP

(57) ABSTRACT

A method for fabricating a semiconductor device is provided. The method includes forming a fin structure extending along a first lateral direction; forming a dummy gate structure that is over a portion of the fin structure and extends along a second direction perpendicular to the first lateral direction; growing source/drain structures that are respectively coupled to ends of the portion of the fin structure; removing the dummy gate structure to form a gate trench; lining inner sidewalls of the gate trench with a gate spacer; and forming an active gate structure in the gate trench.

20 Claims, 27 Drawing Sheets

(51) Int. Cl.
  *H10D 62/13*  (2025.01)
  *H10D 64/01*  (2025.01)
  *H10D 84/01*  (2025.01)
  *H10D 84/03*  (2025.01)
  *H10D 84/83*  (2025.01)

(56) References Cited

OTHER PUBLICATIONS

Notice of Allowance on U.S. Appl. No. 17/371,907 Dtd Mar. 7, 2024.

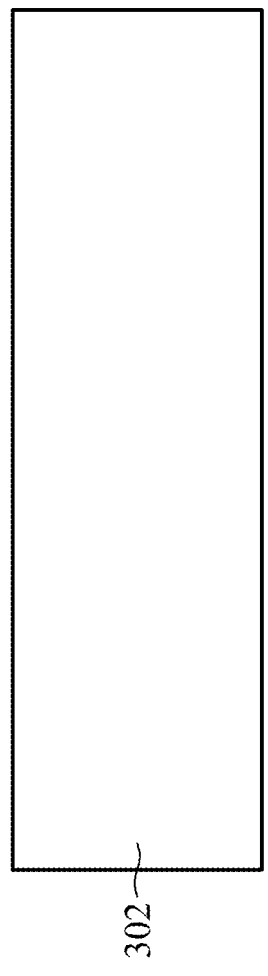
FIG. 3
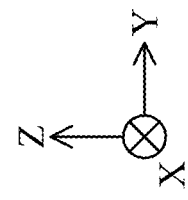

US 12,426,311 B1

GATE STRUCTURES AND SPACERS IN SEMICONDUCTOR DEVICES AND METHODS OF MANUFACTURING THEREOF

This is a divisional of U.S. patent application Ser. No. 17/371,907, filed on Jul. 9, 2021, titled "SEMICONDUCTOR DEVICES AND METHODS OF MANUFACTURING THEREOF," the entire contents of which are incorporated herein by reference for all purposes.

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4A, 4B, 5, 6, 7, 8A, 8B, 9, 10, 11A, 11B, 11C, 12, 13A, 13B, 13C, 13D, 14, and 15 illustrate cross-sectional views of an example GAA FET device (or a portion of the example GAA FET device) during various fabrication stages, made by the method of FIG. 2, in accordance with some embodiments.

DETAILED DESCRIPTION

Figure 1:
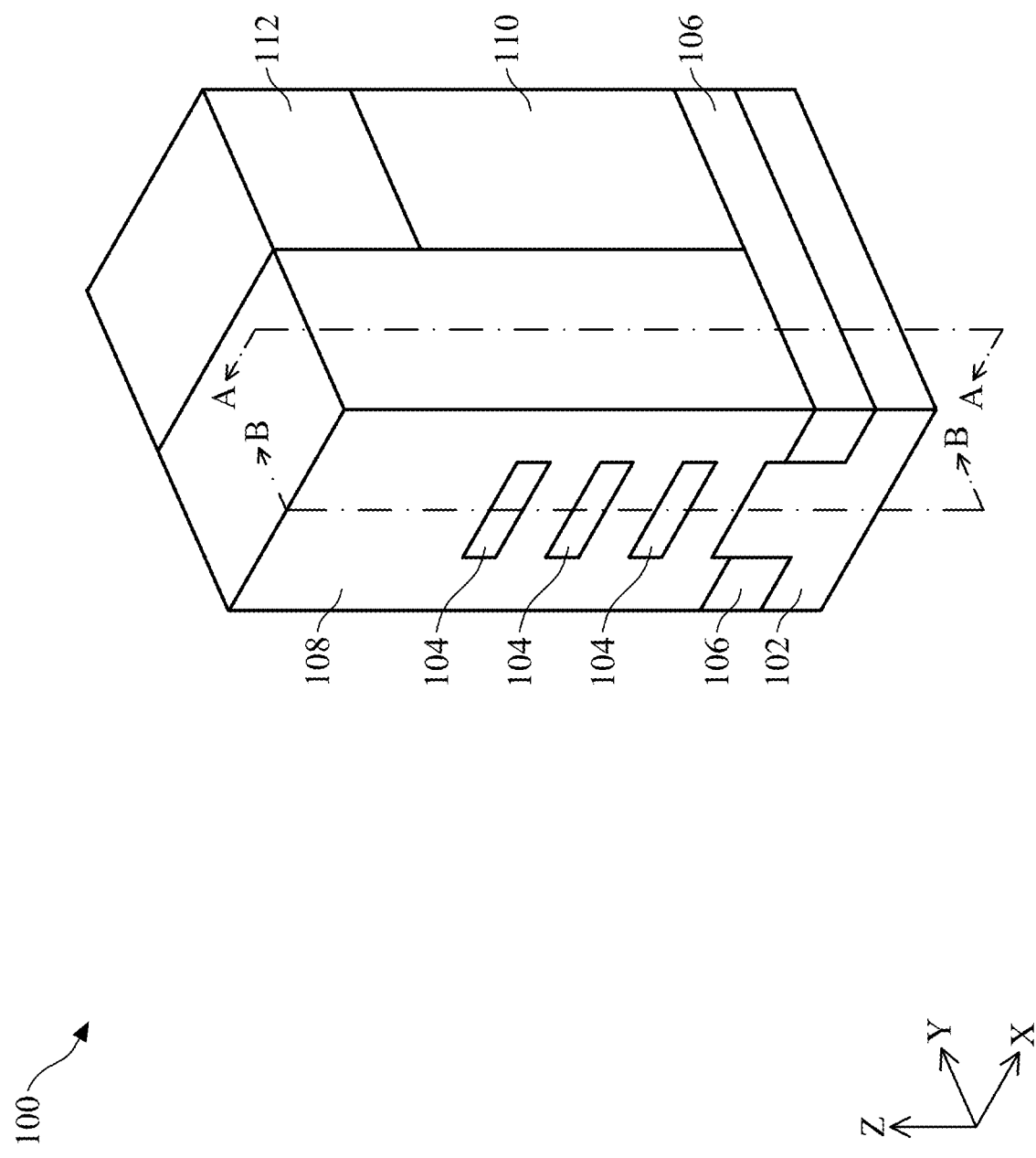
FIG. 1 illustrates a perspective view of a gate-all-around (GAA) field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a gate-all-around (GAA) field-effect-transistor (FET) device, and in particular, in the context of forming a replacement gate of a GAA FET device. In some embodiments, a dummy gate structure is formed over a fin including a number of first semiconductor layers and a number of second semiconductor layers, which serve as sacrificial layers and channel layers, respectively. The dummy gate structure may be formed of a material unfavorable for epitaxial growth. Next, source/drain structures are formed on opposite sides of the dummy gate structure, with an interlayer dielectric (ILD) overlaying them. Upon forming the ILD, the dummy gate structure is removed to form a gate trench. A gate spacer is then formed over the gate trench, followed by breaking through a portion of the gate spacer to expose the topmost first or second semiconductor layer. Next, the sacrificial layers are removed to extend the gate trench. An active gate structure is next formed in the gate trench to wrap around each of the channel layers.

An active gate structure formed by the above described method can provide various advantages in advanced technology nodes. In general, a dummy gate structure is replaced with an active gate structure, and thus, a critical dimension of the active gate structure may inherit the dimensions of the dummy gate structure, as formed. The disclosed dummy gate structure, which does not include a gate spacer prior to forming the ILD, can be formed wider by incorporating the real state (e.g., thickness) of a gate spacer. Consequently, it may significantly reduce the chance of the dummy gate structure to collapse during the subsequent processing steps. Further, as the disclosed dummy gate structure includes one or more materials unfavorable for epitaxial growth, undesired epitaxial growth around the dummy gate structure (e.g., while forming the source/drain structures) can be avoided. Still further, since the gate spacer is formed after growing the source/drain structures, a greater amount of selection on the material of the gate spacer is provided. This is because the concern about undesired epitaxial growth around the gate spacer can be eliminated.

FIG. 1 illustrates a perspective view of an example GAA FET device 100, in accordance with various embodiments. The GAA FET device 100 includes a substrate 102 and a number of nanostructures (e.g., nanosheets, nanowires, etc.) 104 above the substrate 102. The semiconductor layers 104 are vertically separated from one another. Isolation regions 106 are formed on opposing sides of a protruded portion of the substrate 102, with the nanostructures 104 disposed above the protruded portion. A gate structure 108 wraps around each of the nanostructures 104 (e.g., a full perimeter of each of the nanostructures 104). Source/drain structures are disposed on opposing sides of the gate structure 108, e.g., source/drain structure 110 shown in FIG. 1. An interlayer dielectric (ILD) 112 is disposed over the source/drain structure 110.

FIG. 1 depicts a simplified GAA FET device, and thus, it should be understood that one or more features of a completed GAA FET device may not be shown in FIG. 1. For example, the other source/drain structure opposite the gate structure 108 from the source/drain structure 110 and the ILD disposed over such a source/drain structure are not shown in FIG. 1. Further, FIG. 1 is provided as a reference to illustrate a number of cross-sections in subsequent figures. As indicated, cross-section A-A extends along a longitudinal axis of the gate structure 108 (e.g., in the X direction). Cross-section B-B, which is perpendicular to the cross-section A-A, extends along a longitudinal axis of the semiconductor layers 104 and in a direction of a current flow between the source/drain structures (e.g., in the Y direction). Subsequent figures refer to these reference cross-sections for clarity.

Figure 2:
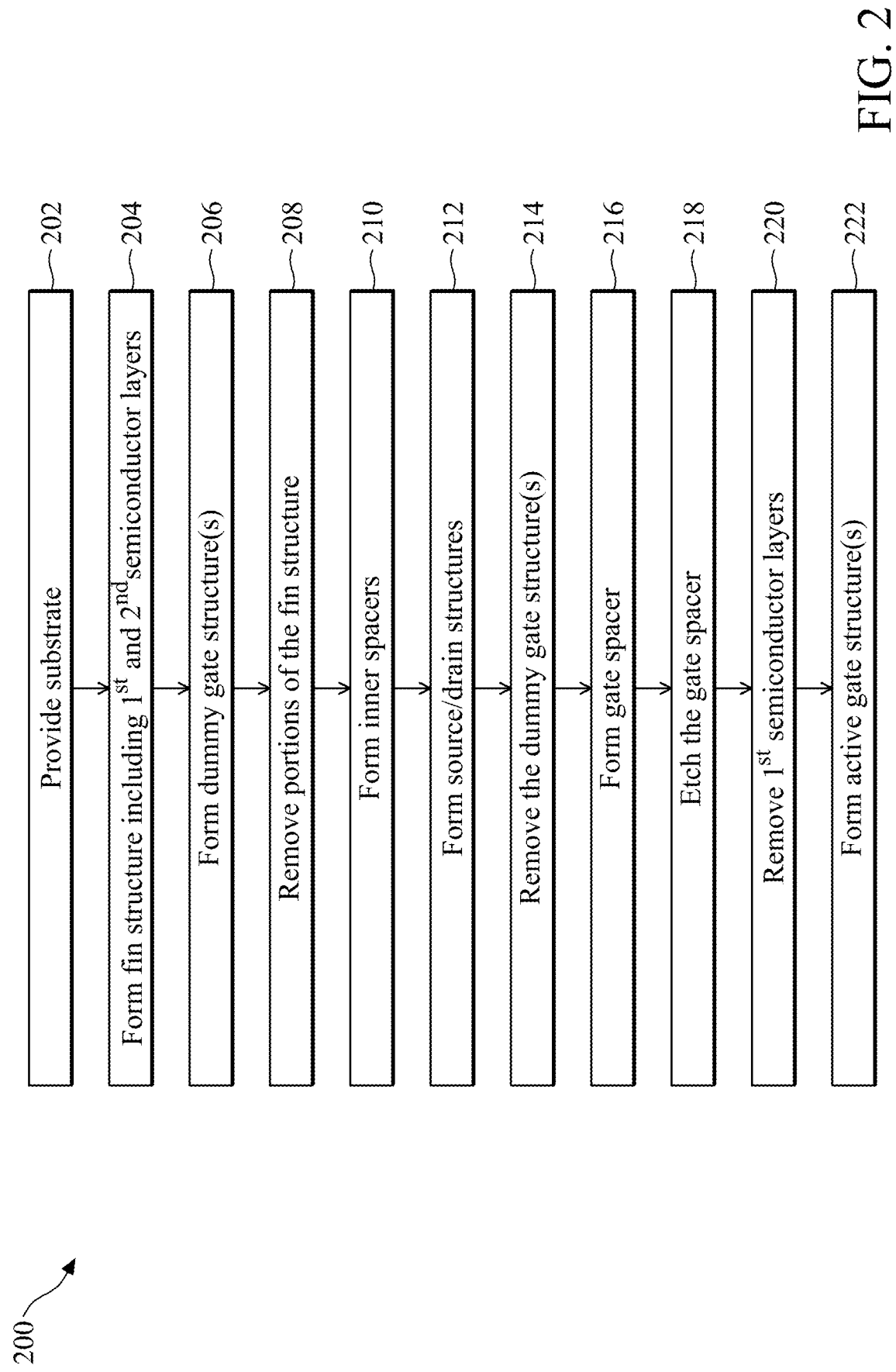
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device, a GAA FET device (e.g., GAA FET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example GAA FET device at various fabrication stages as shown in FIGS. 3, 4A, 4B, 5, 6, 7, 8A, 8B, 9, 10, 11A, 11B, 11C, 12, 13A, 13B, 13C, 13D, 14, and 15, respectively, which will be discussed in further detail below.

In brief overview, the method 200 starts with operation 202 of providing a substrate. The method 200 continues to operation 204 of forming a fin structure including a number of first semiconductor layers and a number of second semiconductor layers. The method 200 continues to operation 206 of forming one or more dummy gate structures. The method 200 continues to operation 208 of removing portions of the fin structure. The method 200 continues to operation 210 of forming inner spacers. The method 200 continues to operation 212 of forming source/drain structures. The method 200 continues to operation 214 of removing the one or more dummy gate structures. The method 200 continues to operation 216 of forming a gate spacer. The method 200 continues to operation 218 of etching the gate spacer. The method 200 continues to operation 220 of removing the first semiconductor layers. The method 200 continues to operation 222 of forming one or more active gate structures.

As mentioned above, FIGS. 3-15 each illustrate, in a cross-sectional view, a portion of a GAA FET device 300 at various fabrication stages of the method 200 of FIG. 2. The GAA FET device 300 is similar to the GAA FET device 100 shown in FIG. 1, but with multiple gate structures. Although FIGS. 3-15 illustrate the GAA FET device 300, it is understood the GAA FET device 300 may include a number of other devices such as inductors, fuses, capacitors, coils, etc., which are not shown in FIGS. 3-15, for purposes of clarity of illustration.

Corresponding to operation 202 of FIG. 2, FIG. 3 is a cross-sectional view of the GAA FET device 300 including a semiconductor substrate 302 at one of the various stages of fabrication. The cross-sectional view of FIG. 3 is cut in a direction perpendicular to the lengthwise direction of an active/dummy gate structure of the GAA FET device 300 (e.g., cross-section B-B indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4A:
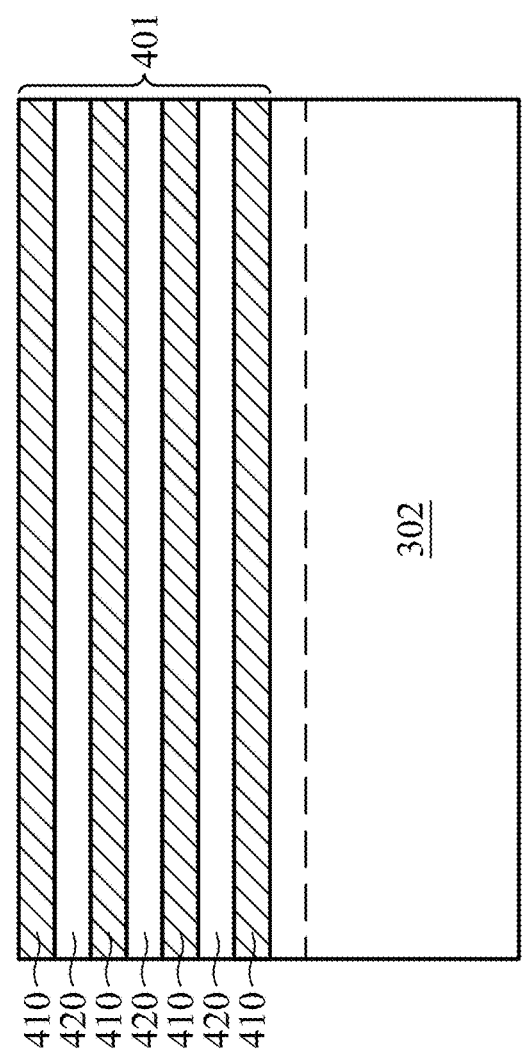
Figure 4B:
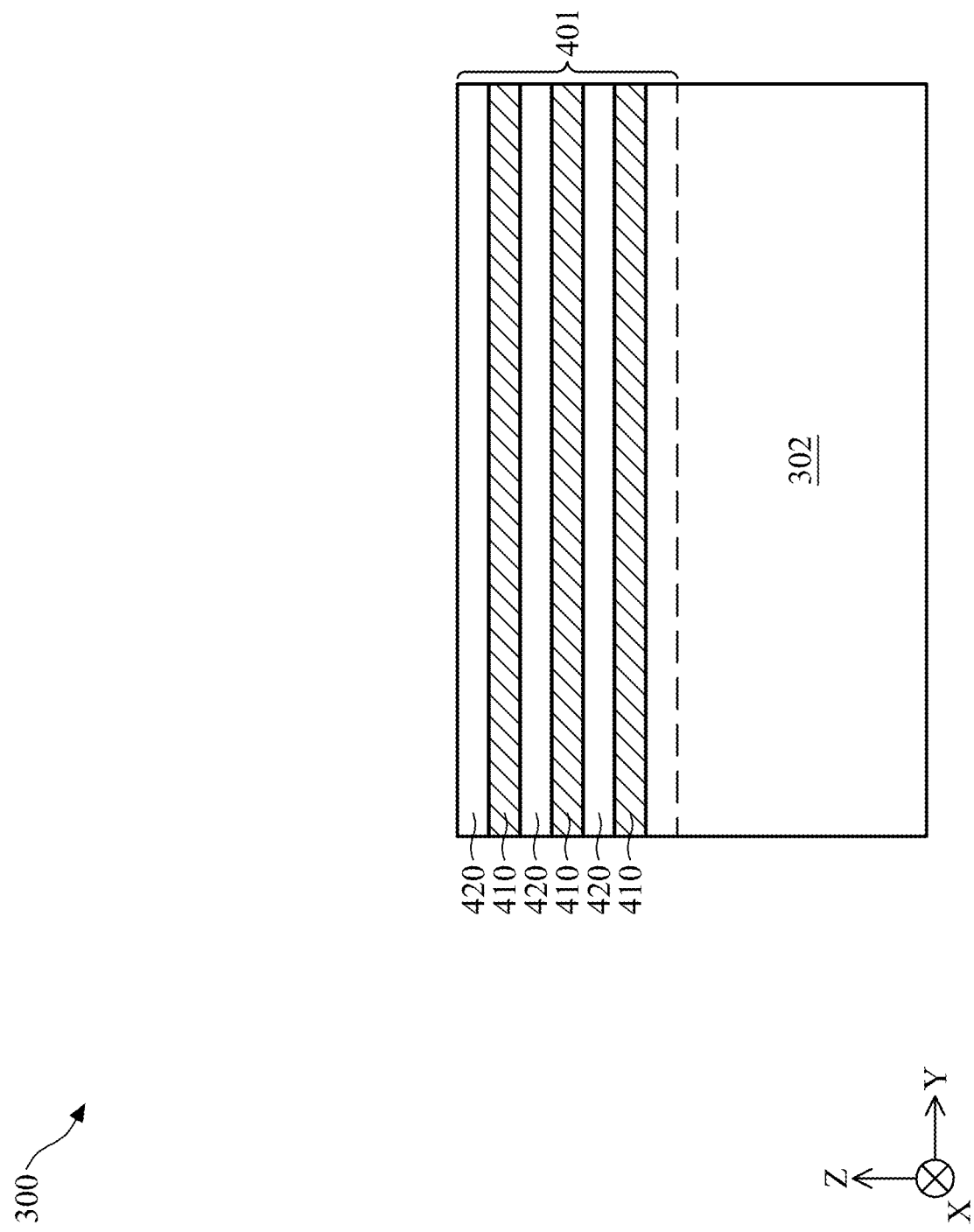

Corresponding to operation 204 of FIG. 2, FIG. 4A is a cross-sectional view of the GAA FET device 300 including a number of first semiconductor layers 410 and a number of second semiconductor layers 420 formed on the substrate 302 at one of the various stages of fabrication. Still corresponding to operation 204 of FIG. 2, FIG. 4B is a cross-sectional view of the GAA FET device 300 including a different number of the first semiconductor layers 410 and the same number of second semiconductor layers 420 formed on the substrate 302 at one of the various stages of fabrication. The cross-sectional views of FIGS. 4A-B are each cut in a direction perpendicular to the lengthwise direction of an active/dummy gate structure of the GAA FET device 300 (e.g., cross-section B-B indicated in FIG. 1).

Referring first to FIG. 4A, the first semiconductor layers 410 and the second semiconductor layers 420 are alternatingly disposed on top of one another (e.g., along the Z direction) to form a first stack. For example, one of the second semiconductor layers 420 is disposed over one of the first semiconductor layers 410 then another one of the first semiconductor layers 420 is disposed over the second semiconductor layer 410, so on and so forth. Similar in FIG. 4B, the first semiconductor layers 410 and the second semiconductor layers 420 are alternatingly disposed on top of one another (e.g., along a vertical direction) to form a second stack.

The first and second stacks may include any number of alternately disposed first and second semiconductor layers 410 and 420, respectively. For example in FIG. 4A, the first stack includes 4 first semiconductor layers 410, with 3 second semiconductor layers 420 alternatingly disposed therebetween and with one of the first semiconductor layers 410 being the topmost semiconductor layer; and for example in FIG. 4B, the second stack includes 3 first semiconductor layers 410, with 2 second semiconductor layers 420 alternatingly disposed therebetween and with one of the second semiconductor layer 420 being the topmost semiconductor layer. It should be understood that the GAA FET device 300 can include any number of first semiconductor layers and any number of second semiconductor layers, with either one of the first or second semiconductor layers being the topmost semiconductor layer, while remaining within the scope of the present disclosure. Thus, in most of the following discussion, the stack shown in FIG. 4A will be used as a representative example.

The semiconductor layers 410 and 420 may have respective different thicknesses. Further, the first semiconductor layers 410 may have different thicknesses from one layer to another layer. The second semiconductor layers 420 may have different thicknesses from one layer to another layer. The thickness of each of the semiconductor layers 410 and 420 may range from few nanometers to few tens of nanometers. The first layer of the stack may be thicker than other semiconductor layers 410 and 420. In an embodiment, each of the first semiconductor layers 410 has a thickness ranging from about 5 nanometers (nm) to about 20 nm, and each of the second semiconductor layers 420 has a thickness ranging from about 5 nm to about 20 nm.

The two semiconductor layers 410 and 420 have different compositions. In various embodiments, the two semiconductor layers 410 and 420 have compositions that provide for different oxidation rates and/or different etch selectivity between the layers. In an embodiment, the first semiconductor layers 410 include silicon germanium ($Si_{1-x}Ge_x$), and the second semiconductor layers include silicon (Si). In an embodiment, each of the semiconductor layers 420 is silicon that may be undoped or substantially dopant-free (i.e., having an extrinsic dopant concentration from about 0 $cm^{-3}$ to about $1 \times 10^{17}$ $cm^{-3}$), where for example, no intentional doping is performed when forming the layers 420 (e.g., of silicon).

In various embodiments, the semiconductor layers 420 may be intentionally doped. For example, when the GAA FET device 300 is configured in n-type (and operates in an enhancement mode), each of the semiconductor layers 420 may be silicon that is doped with a p-type dopant such as boron (B), aluminum (Al), indium (In), and gallium (Ga); and when the GAA FET device 300 is configured in p-type (and operates in an enhancement mode), each of the semiconductor layers 420 may be silicon that is doped with an n-type dopant such as phosphorus (P), arsenic (As), antimony (Sb). In another example, when the GAA FET device 300 is configured in n-type (and operates in a depletion mode), each of the semiconductor layers 420 may be silicon that is doped with an n-type dopant instead; and when the GAA FET device 300 is configured in p-type (and operates in a depletion mode), each of the semiconductor layers 420 may be silicon that is doped with a p-type dopant instead. In some embodiments, each of the semiconductor layers 410 is $Si_{1-x}Ge_x$ that includes less than 50% (x<0.5) Ge in molar ratio. For example, Ge may comprise about 15% to 35% of the semiconductor layers 410 of $Si_{1-x}Ge_x$ in molar ratio. Furthermore, the first semiconductor layers 410 may include different compositions among them, and the second semiconductor layers 420 may include different compositions among them.

Either of the semiconductor layers 410 and 420 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 410 and 420 may be chosen based on providing differing oxidation rates and/or etch selectivity.

The semiconductor layers 410 and 420 can be epitaxially grown from the semiconductor substrate 302. For example, each of the semiconductor layers 410 and 420 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the semiconductor layers 410 and 420 having the same crystal orientation with the semiconductor substrate 302.

Upon growing the semiconductor layers 410 and 420 on the semiconductor substrate 302 (as a stack), the stack may be patterned to form one or more fin structures (e.g., 401). Each of the fin structures is elongated along a lateral direction (e.g., the Y direction), and includes a stack of patterned semiconductor layers 410-420 interleaved with each other. The fin structure 401 is formed by patterning the semiconductor layers 410-420 and the semiconductor substrate 302 using, for example, photolithography and etching techniques. For example, a mask layer (which can include multiple layers such as, for example, a pad oxide layer and an overlying pad nitride layer) is formed over the topmost semiconductor layer (e.g., 410 in FIG. 4A, or 420 in FIG. 4B). The pad oxide layer may be a thin film comprising silicon oxide formed, for example, using a thermal oxidation process. The pad oxide layer may act as an adhesion layer between the topmost semiconductor layer 410 (or the semiconductor layer 420 in some other embodiments) and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the semiconductor layers 410-420 and the substrate 302 to form trenches (or openings), thereby defining the fin structures 401 between adjacent trenches. When multiple fin structures are formed, such a trench may be disposed between any adjacent ones of the fin structures. In some embodiments, the fin structure 401 is formed by etching trenches in the semiconductor layers 410-420 and substrate 302 using, for example, reactive ion etch (RIE), neutral beam etch (NBE), the like, or combinations thereof. The etch may be anisotropic. In some embodiments, the trenches may be strips (when viewed from the top) parallel to each other, and closely spaced with respect to each other. In some embodiments, the trenches may be continuous and surround the fin structure 401.

Figure 5:
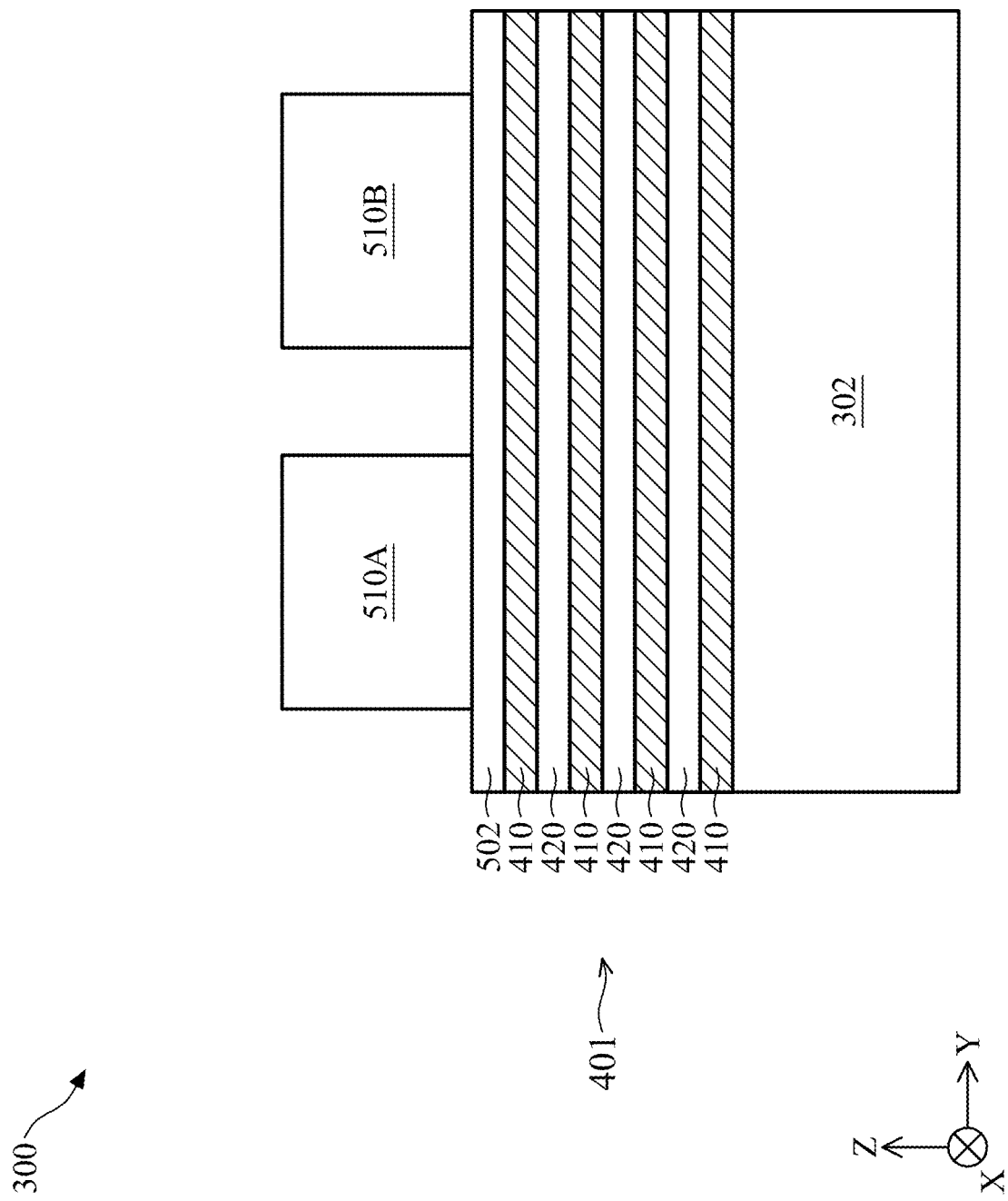

Corresponding to operation 206 of FIG. 2, FIG. 5 is a cross-sectional view of the GAA FET device 300 including one or more dummy gate structures 510A and 510B, at one of the various stages of fabrication. The cross-sectional view of FIG. 5 is cut in a direction perpendicular to the lengthwise direction of an active/dummy gate structure of the GAA FET device 300 (e.g., cross-section B-B indicated in FIG. 1).

Prior to forming the dummy gate structures 510A-B, an etch stop layer (ESL) 502 can be formed over the fin structure 401. Although not shown, on each of the sides of the fin structure 401 (along the X direction), a cladding layer (similar as the first semiconductor layer) and a dummy fin structure (overlaid or protected by a high-k dielectric layer) can be formed to produce a substantially planar top surface shared by the fin structure 401, the cladding layer, and the dummy fin structure. As used herein, the term "substantially planar" refers to a structure when the deviation of the structure from a plane is within the statistical atomic level variations inherent within semiconductor processing methods known in the art. In some embodiments, the ESL 502 may be formed over such a substantially planar top surface. In some other embodiments, the ESL 502 may be formed over only a top surface of the fin structure 401. The etching stop layer 502 may include silicon oxide. The ESL 502 may be formed by a deposition process, such as chemical vapor deposition (CVD) (e.g., plasma enhanced chemical vapor deposition (PECVD), high aspect ratio process (HARP), or combinations thereof) process, atomic layer deposition (ALD) process, another applicable process, or combinations thereof.

Next, the dummy gate structures 510A-B are formed over the ESL 502. The dummy gate structures 510A-B can each extend along a lateral direction (e.g., the X direction) perpendicular to the lateral direction along which the fin structure 401 extends. The dummy gate structures 510A-B may be placed where respective active (e.g., metal) gate structures are later formed, in various embodiments. For example in FIG. 5, each of the dummy gate structures 510A-B is placed over a respective portion of fin structure 401, with the ESL 502 sandwiched therebetween. Such an overlaid portion of the fin structure 401 is later formed as a conduction channel, which includes portions of the second semiconductor layers 420, and the dummy gate structures 510A-B are each replaced with an active gate structure to warp around each of the portions of the second semiconductor layers 420.

The dummy gate structures 510A-B each include a material unfavorable for epitaxial growth, in some embodiments. As such, in a later stage of process where epitaxial growth is performed (e.g., when forming source/drain structures), the epitaxial growth can be significantly limited around the dummy gate structures 510A-B (e.g., along sidewalls of the dummy gate structures 510A-B). In some embodiments, the dummy gate structures 510A-B can each include one or more silicon-based dielectric materials such as, for example, silicon oxide, silicon nitride, silicon oxynitride, silicon carbide, silicon carbonitride, silicon oxycarbonitride, silicon oxycarbide, multilayers thereof, or combinations thereof, and may be deposited. In some embodiments, the dummy gate structures 510A-B can each include one or more metal-based materials such as, for example, cobalt, tungsten, hafnium oxide, aluminum oxide, or combinations thereof, and may be deposited.

Figure 6:
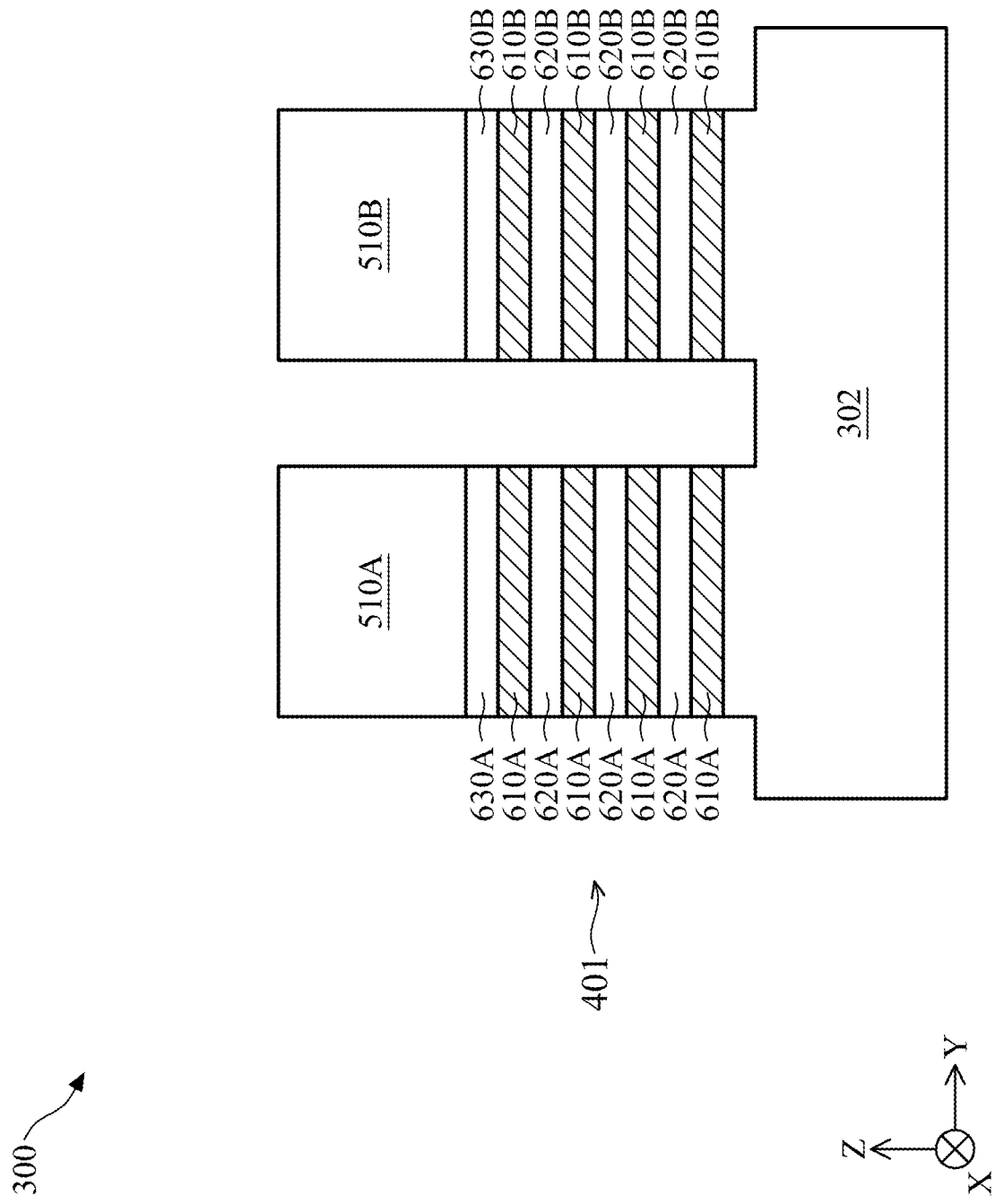

Corresponding to operation 208 of FIG. 2, FIG. 6 is a cross-sectional view of the GAA FET device 300 in which portions of the fin structure 401 that are not overlaid by the dummy gate structures 510A-B are removed, at one of the various stages of fabrication. The cross-sectional view of FIG. 6 is cut in a direction perpendicular to the lengthwise direction of an active/dummy gate structure of the GAA FET device 300 (e.g., cross-section B-B indicated in FIG. 1).

The dummy gate structures 510A-B can serve as a mask to etch the non-overlaid portions of the fin structure 401, which results in the fin structure 401 having one or more alternatingly stacks including remaining portions of the semiconductor layers 410 and 420 and the ESL 502. As a result, along the Z direction, newly formed sidewalls of each of the fin structures 401 are aligned with sidewalls of the dummy gate structure 510A or 510B. For example in FIG. 6, semiconductor layers 610A, 620A, and ESL 630A are the remaining portions of the semiconductor layers 410, 420, and ESL 502 overlaid by the dummy gate structure 510A, respectively; and semiconductor layers 610B, 620B, and ESL 630B are the remaining portions of the semiconductor layers 410, 420, and ESL 502 overlaid by the dummy gate structure 510B, respectively. In some embodiments, the semiconductor layers 610A, 620A, 610B, and 620B may sometimes be referred to as nanostructures 610A, 620A, 610B, and 620B, respectively.

Figure 7:
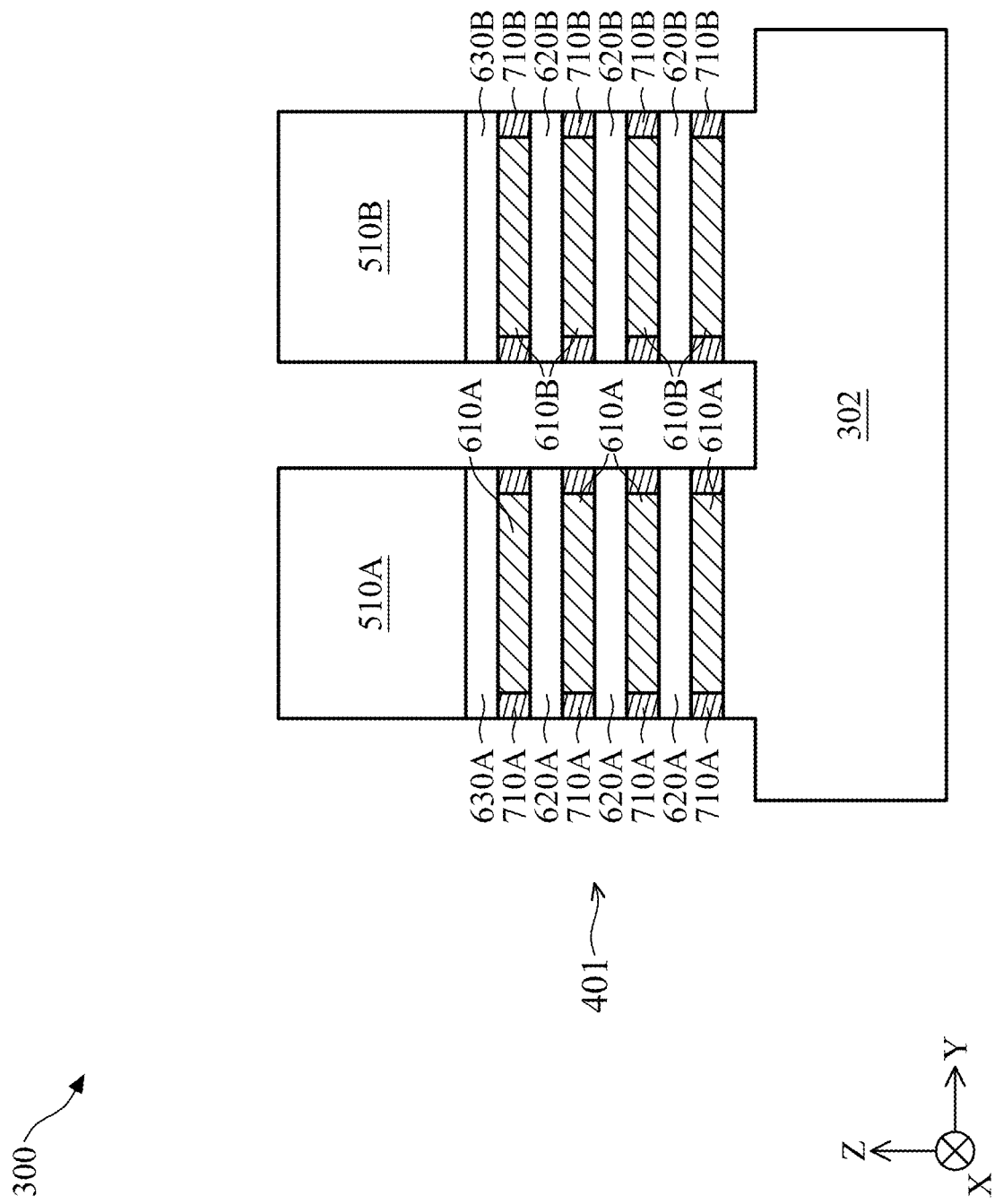

Corresponding to operation 210 of FIG. 2, FIG. 7 is a cross-sectional view of the GAA FET device 300 including inner spacers 710A and 710B, at one of the various stages of fabrication. The cross-sectional view of FIG. 7 is cut in a direction perpendicular to the lengthwise direction of an active/dummy gate structure of the GAA FET device 300 (e.g., cross-section B-B indicated in FIG. 1).

The inner spacers 710A are formed along respective etched ends of the semiconductor layers 610A; and the inner spacers 710B are formed along respective etched ends of the semiconductor layers 610B. To form the inner spacers 710A-B, respective end portions of each of the semiconductor layers 610A-B may first be removed. The end portions of the semiconductor layers 610A-B can be removed (e.g., etched) using a "pull-back" process to pull the semiconductor layers 610A-B back by an initial pull-back distance. Although in the illustrated embodiment of FIG. 7, the etched ends of each of the semiconductor layers 610A-B are approximately vertical (e.g., in parallel with the sidewalls of the dummy gate structures 510A-B, it should be understood that the etched ends may be curved inwardly or outwardly, which will be shown in FIGS. 8A and 8B. In an example where the semiconductor layers 620A-B include Si, and the semiconductor layers 610A-B include $Si_{1-x}Ge_x$, the pull-back process may include a hydrogen chloride (HCl) gas isotropic etch process, which etches SiGe without attacking Si. As such, the Si layers 620A-B may remain intact during this process.

Next, the inner spacers 710A-B can be formed along the etched ends of each of the semiconductor layers 610A-B. Thus, the inner spacers 710A-B (e.g., their respective inner sidewalls) may follow the profile of the etched ends of the semiconductor layers 610A-B. In some embodiments, the inner spacers 710A-B can be formed conformally by chemical vapor deposition (CVD), or by monolayer doping (MLD) of nitride followed by spacer RIE. The inner spacers 710A-B can be deposited using, e.g., a conformal deposition process and subsequent isotropic or anisotropic etch back to remove excess spacer material on the sidewalls of the stacks of the fin structure 401 and on a surface of the semiconductor substrate 302. A material of the inner spacers 710A-B can be formed from the same or different material as the dummy gate structures 510A-B. For example, the inner spacers 710A-B can be formed of silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

Figure 8A:
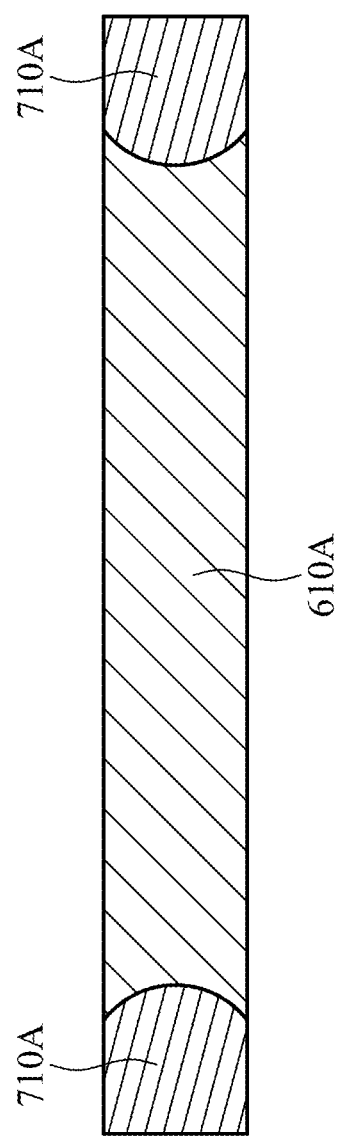
Figure 8B:
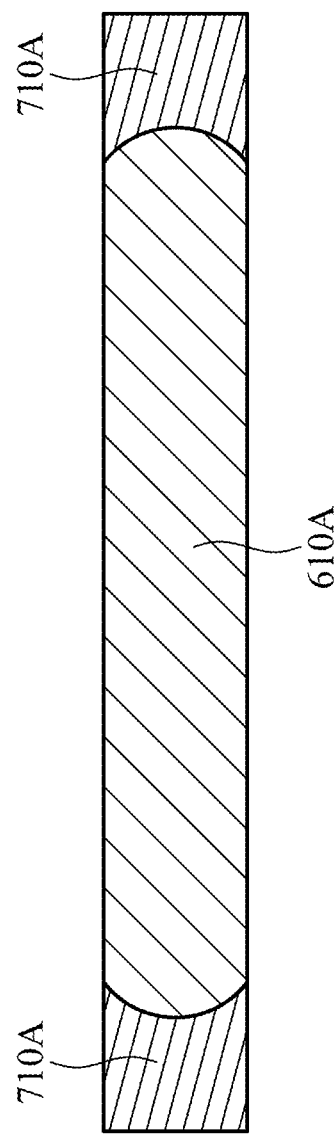

FIGS. 8A and 8B illustrate other embodiments of the profile of the inner spacers 710A-B, in which the inner spacer 710A is used as a representative example. As shown in FIG. 8A, the inner spacer 710A follows the profile of the etched end of the semiconductor layer 610A, which has a curvature-based profile inwardly protruding toward the semiconductor layer 610A. As such, the inner spacer 710A may have a convex inner sidewall. As shown in FIG. 8B, the inner spacer 710A follows the profile of the etched end of the semiconductor layer 610A, which has a curvature-based profile outwardly protruding from the semiconductor layer 610A. As such, the inner spacer 710A may have a concave inner sidewall.

Figure 9:
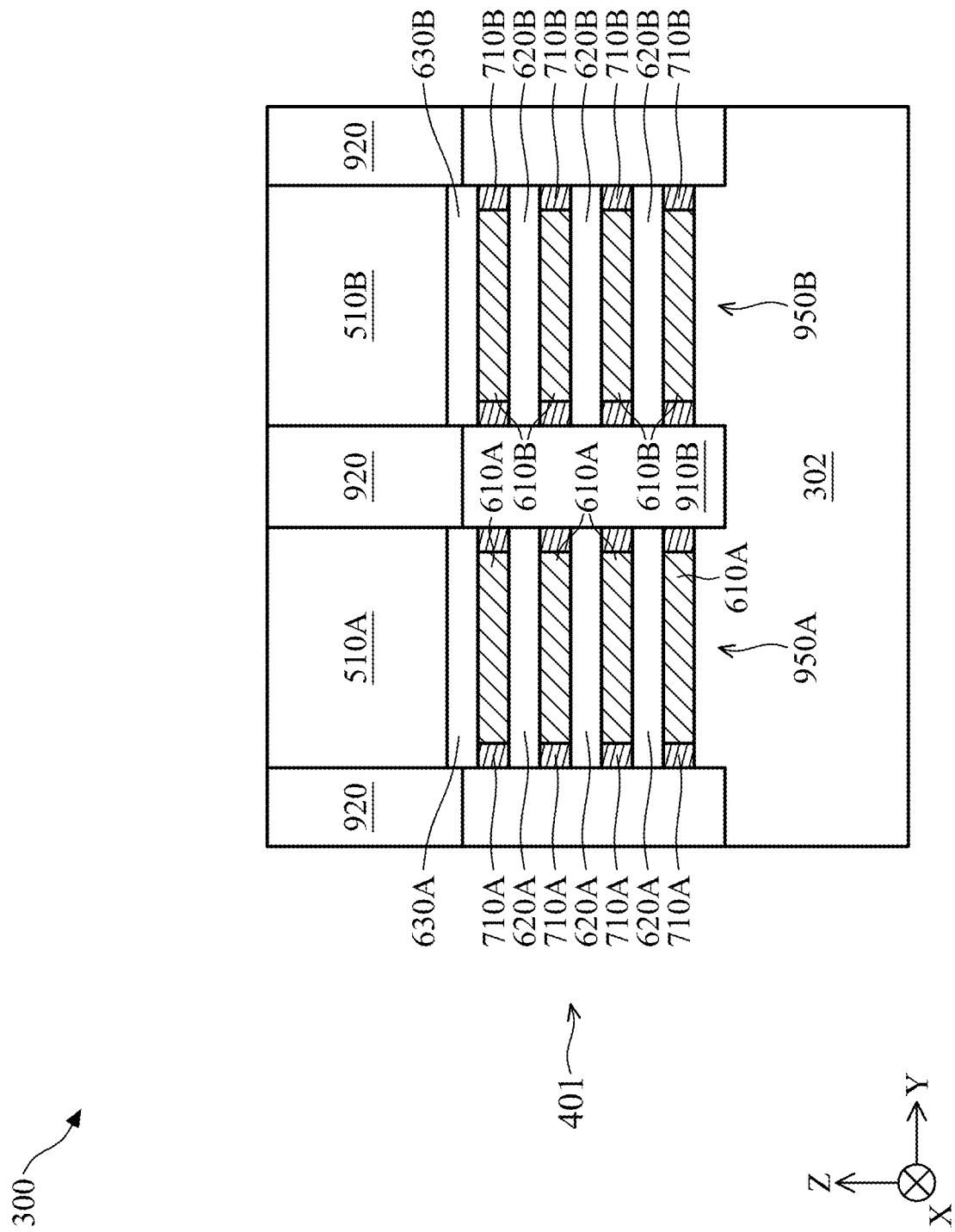

Corresponding to operation 212 of FIG. 2, FIG. 9 is a cross-sectional view of the GAA FET device 300 including source/drain structures 910A, 910B, and 910C that are overlaid by an interlayer dielectric (ILD) 920, at one of the various stages of fabrication. The cross-sectional view of FIG. 9 is cut in a direction perpendicular to the lengthwise direction of an active/dummy gate structure of the GAA FET device 300 (e.g., cross-section B-B indicated in FIG. 1).

The source/drain structures 910A-C may be formed using an epitaxial layer growth process on exposed ends of each of the semiconductor layers 620A-B. In some embodiments, a bottom surface of the source/drain structures 910A-C may be leveled with the top surface of an isolation structure (not shown) that embeds a lower portion of the fin structure 401. In some other embodiments, the bottom surface of the source/drain structures 910A-C may be lower than the top surface of such an isolation structure. On the other hand, in some embodiments, a top surface of the source/drain structures 910A-C may be higher than a top surface of the topmost semiconductor layers 610A-B, as shown in FIG. 9. In some other embodiments, the top surface of the source/drain structures 910A-C may be leveled with or lower than the top surface of the topmost semiconductor layers 610A-B. As the dummy gate structures 510A-B are formed of a material unfavorable for epitaxial growth, the top surface of the source/drain structures 910A-C may not be higher than a bottom surface of the dummy gate structures 510A-B (or a top surface of the ESLs 630A-B).

The source/drain structures 910A-C are electrically coupled to the respective semiconductor layers 620A-B. For example, the source/drain structures 910A-B can be electrically coupled to the semiconductor layers 620A; and the source/drain structures 910B-C can be electrically coupled to the semiconductor layers 620B. In various embodiments, the semiconductor layers 620A may collectively function as the conduction channel of a first GAA transistor (hereinafter "GAA transistor 950A"); and the semiconductor layers 620B may collectively function as the conduction channel of a second GAA transistor (hereinafter "GAA transistor 950B"). It should be noted that at this stage of fabrication, the GAA transistors 950A-B are not finished yet.

In-situ doping (ISD) may be applied to form doped source/drain structures 910A-C, thereby creating the junctions for the GAA transistors 950A-B. N-type and p-type FETs are formed by implanting different types of dopants to selected regions (e.g., the source/drain structures 910A-C) of the device to form the junction(s). N-type devices can be formed by implanting arsenic (As) or phosphorous (P), and p-type devices can be formed by implanting boron (B).

Upon forming the source/drain structures 910A-C, the ILD 920 can be formed by depositing a dielectric material in bulk over the partially formed GAA transistors 950A-B, and polishing the bulk oxide back (e.g., using CMP) to the level of the dummy gate structures 510A-B. The dielectric material of ILD 920 includes silicon oxide, phosphosilicate glass (PSG), borosilicate glass (BSG), boron-doped phosphosilicate Glass (BPSG), undoped silicate glass (USG), or combinations thereof.

Figure 10:
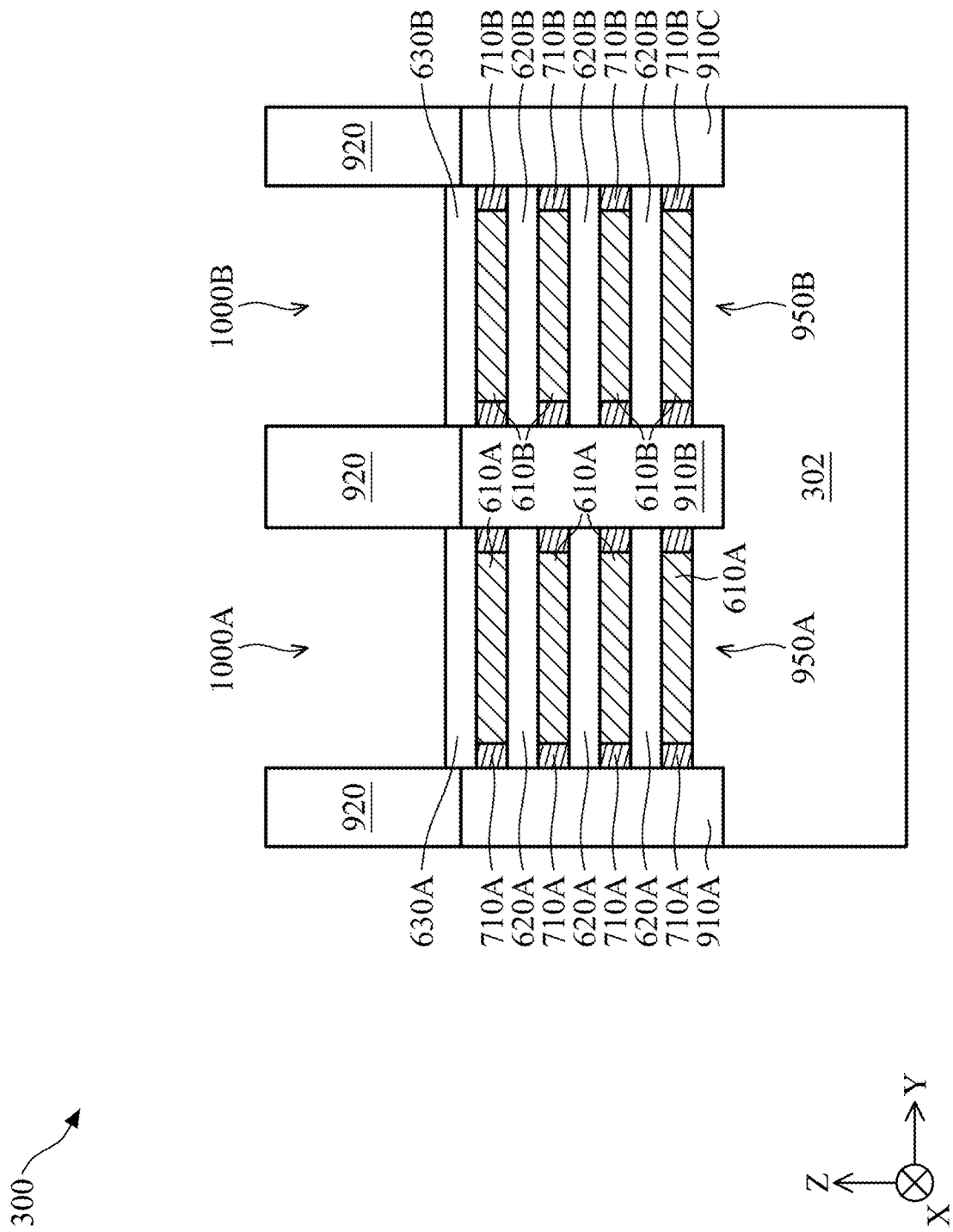

Corresponding to operation 214 of FIG. 2, FIG. 10 is a cross-sectional view of the GAA FET device 300 in which the dummy gate structures 510A-B (FIG. 9) are removed, at one of the various stages of fabrication. The cross-sectional view of FIG. 10 is cut in a direction perpendicular to the lengthwise direction of an active/dummy gate structure of the GAA FET device 300 (e.g., cross-section B-B indicated in FIG. 1).

Subsequently to forming the ILD 920 (FIG. 9), the dummy gate structures 510A-B are removed, thereby forming gate trenches 1000A and 1000B, respectively. The dummy gate structures 510A-B can be removed by a known etching process, e.g., RIE or chemical oxide removal (COR). After the removal of the dummy gate structures 510A-B (forming the gate trenches 1000A-B), the top surface of the ESLs 630A-B are exposed. Although not shown in the cross-sectional view of FIG. 10, it should be appreciated that in addition to the top surface of the ESLs 630A-B, the sidewalls of each of the semiconductor layers 610A-B and 620A-B (facing the X direction) may be exposed, in some embodiments.

Figure 11A:
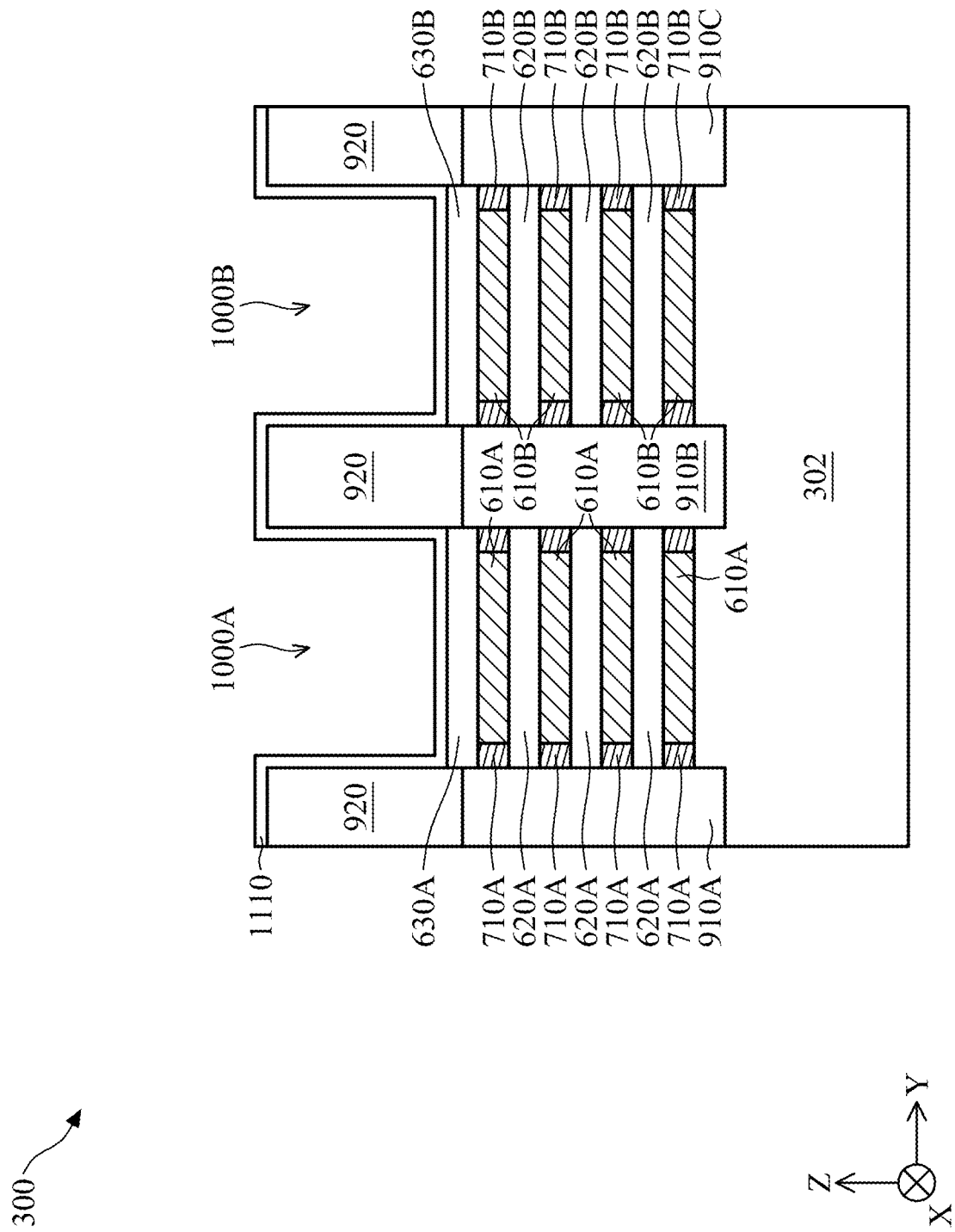
Figure 11B:
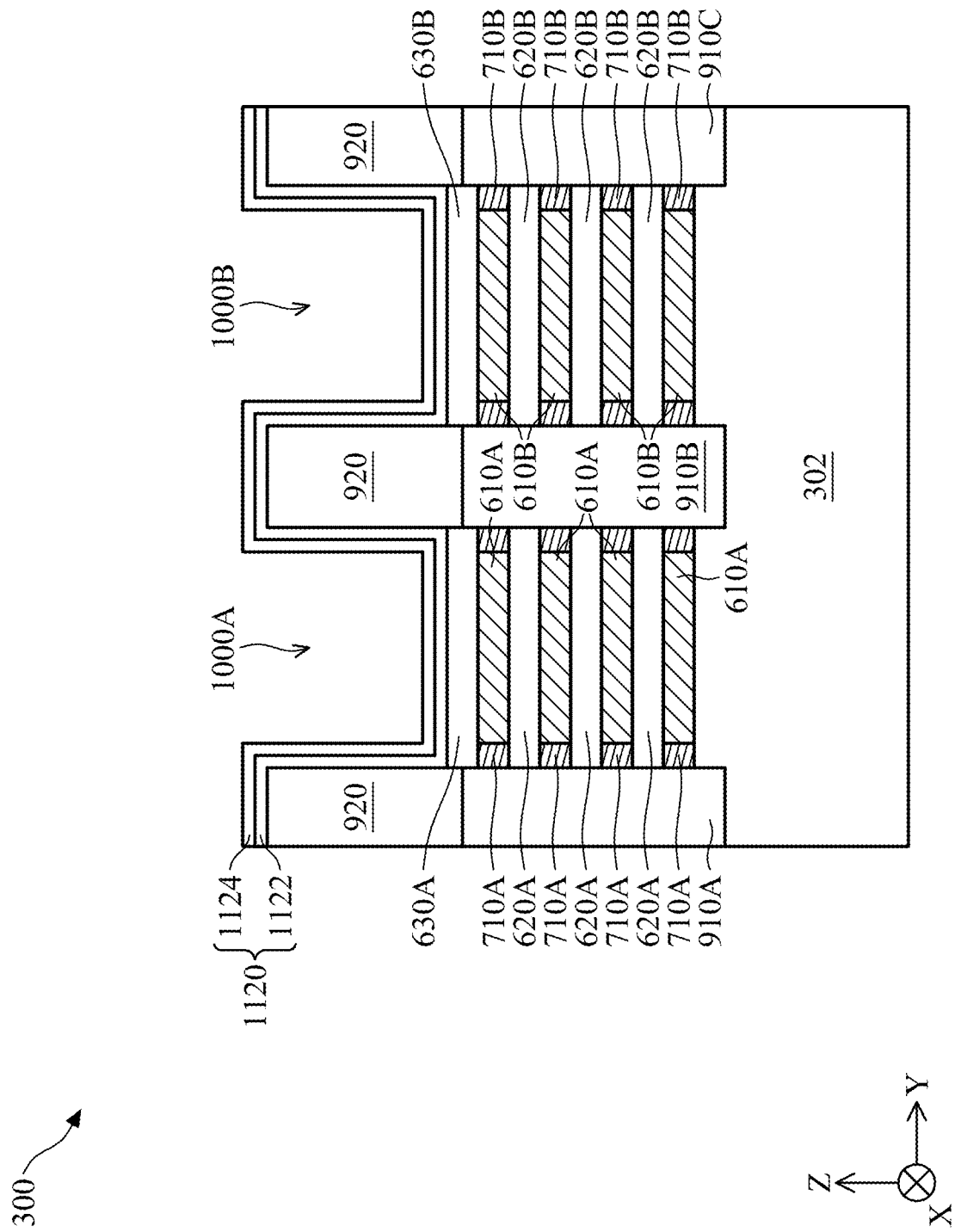
Figure 11C:
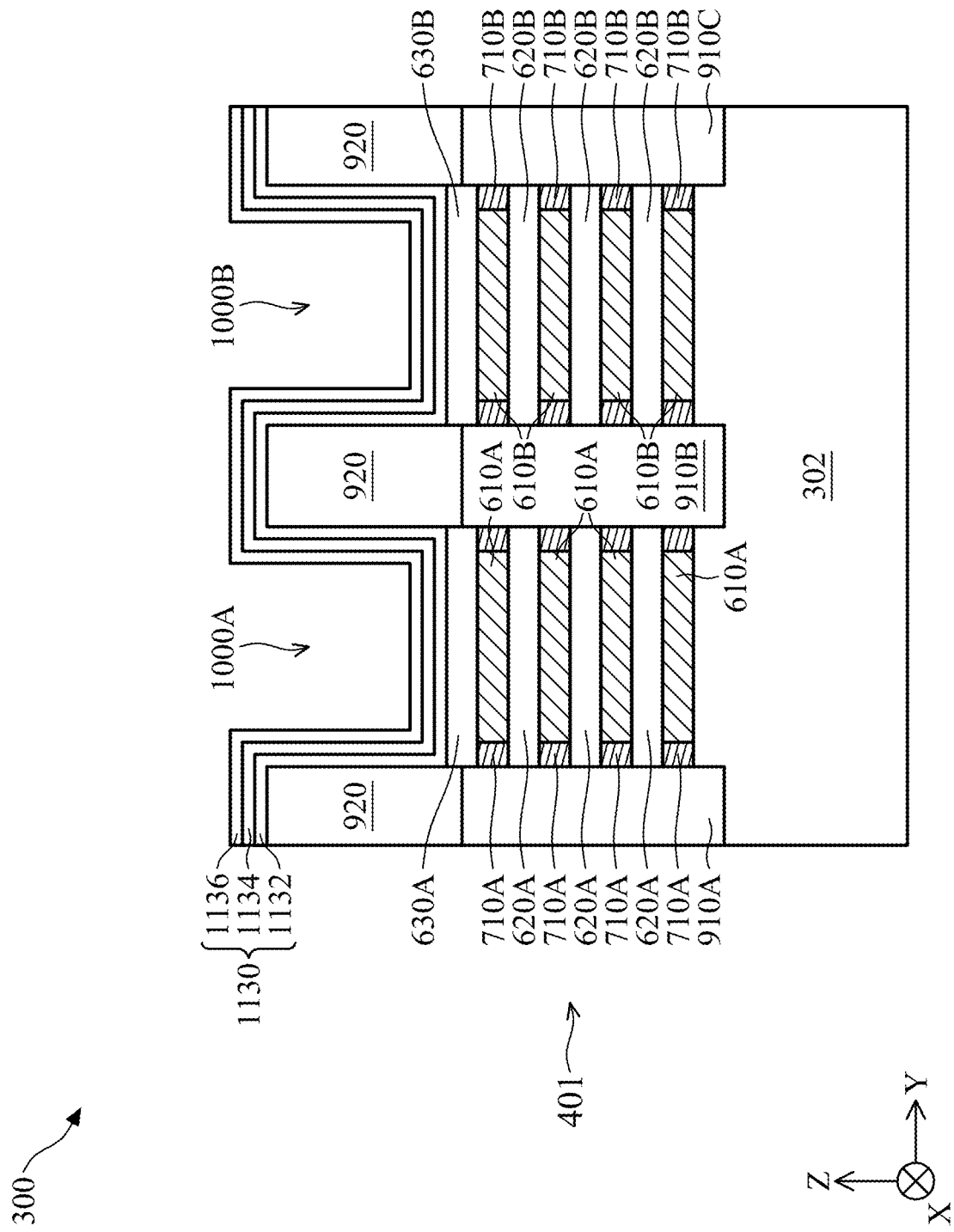

Corresponding to operation 216 of FIG. 2, FIG. 11A is a cross-sectional view of the GAA FET device 300 including a gate spacer 1110, at one of the various stages of fabrication. Still corresponding to operation 216 of FIG. 2, FIG. 11B is a cross-sectional view of the GAA FET device 300 including a gate spacer 1120, at one of the various stages of fabrication. Still corresponding to operation 216 of FIG. 2, FIG. 11C is a cross-sectional view of the GAA FET device 300 including a gate spacer 1130, at one of the various stages of fabrication. The cross-sectional views of FIGS. 11A-C are each cut in a direction perpendicular to the lengthwise direction of an active/dummy gate structure of the GAA FET device 300 (e.g., cross-section B-B indicated in FIG. 1).

Referring first to FIG. 11A, the gate spacer 1110 is formed in the gate trenches 1000A and 1000B. The gate spacer 1110 can be formed as a single conformal layer lining a bottom surface and sidewalls of each of the gate trenches 1000A-B (and a top surface of the ILD 920). Referring then to FIG. 11B, the gate spacer 1120 is formed in the gate trenches 1000A and 1000B. The gate spacer 1120 can be formed as a combination of two conformal layers (e.g., 1122 and 1124), each of which lines the bottom surface and the sidewalls of each of the gate trenches 1000A-B (and the top surface of the ILD 920). Referring then to FIG. 11C, the gate spacer 1130 is formed in the gate trenches 1000A and 1000B. The gate spacer 1130 can be formed as a combination of three conformal layers (e.g., 1132, 1134, and 1136), each of which lines the bottom surface and the sidewalls of each of the gate trenches 1000A-B (and the top surface of the ILD 920). It should be understood that any gate spacer, formed as a combination of any number of conformal layers, can be formed in the gate trenches 1000A-B, while remaining within the scope of the present disclosure. In most of the following discussions, the gate spacer 1120 shown in FIG. 11B will be used as a representative example.

In some embodiments, each of the conformal layers (e.g., 1110, 1122, 1124, 1132, 1134, 1136) includes a dielectric material selected from the group consisting of: silicon nitride, silicon oxynitride, silicon carbonitride, silicon carbide, silicon oxycarbide, the like, or combinations thereof. The conformal layer may be formed using atomic layer deposition (ALD), low-pressure chemical vapor deposition (LPCVD) or plasma enhanced chemical vapor deposition (PECVD), for example. Each of the conformal layers may have a thickness ranging from about 2 angstroms (Å) to about 500 Å.

Figure 12:
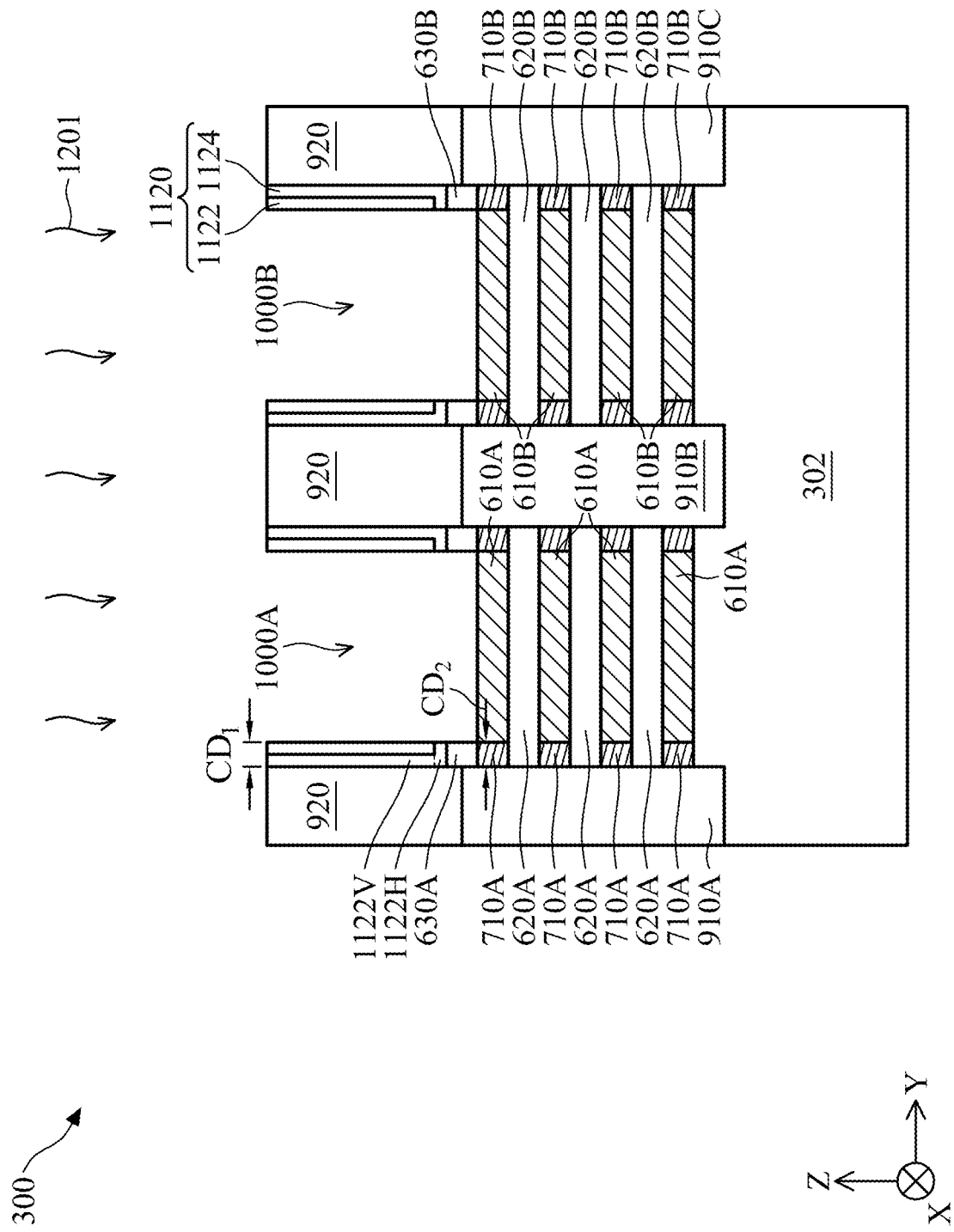

Corresponding to operation 218 of FIG. 2, FIG. 12 is a cross-sectional view of the GAA FET device 300 in which portions of the gate spacer 1120 and the ESLs 630A-B are removed, at one of the various stages of fabrication. The cross-sectional view of FIG. 12 is cut in a direction perpendicular to the lengthwise direction of an active/dummy gate structure of the GAA FET device 300 (e.g., cross-section B-B indicated in FIG. 1).

The portions of the gate spacer 1120 and the ESLs 630A-B that do not extend along the sidewalls of the gate trench 1000A-B may be removed by an etching process 1201, which can include one or more steps. For example, the portion of the gate spacer 1120 disposed over the top surface of the ILD 920 and the portion of the gate spacer 1120 disposed over the bottom surface of the gate trenches 1000A-B (the top surface of the ESLs 630A-B) may be removed by a first step of the etching process 1201, which exposes a portion of the ESLs 630A-B. Next, the exposed portion of the ESLs 630A-B may be removed by a second step of the etching process 1201. In another example, such portions of the gate spacer 1120 and ESLs 630A-B may be collectively removed by one step of the etching process 1201. By removing such portions of the gate spacer 1120 and ESLs 630A-B, the top surface of the topmost semiconductor layers 610A-B is exposed.

The etching process 1201 can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof to control the above-described etching rates. As a non-limiting example, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute may be used in the etching process 1201. However, it is noted that source powers, bias powers, pressures, and flow rates outside of these ranges are also contemplated In another example, the etching process 1201 can include a wet etching process, which can have a certain amount of isotropic characteristic, in combination with the plasma etching process. In such a wet etching process, a main etch chemical such as hydrofluoric acid (HF), fluorine ($F_2$), and other suitable main etch chemicals and combinations thereof can be used with assistive etch chemicals such as sulfuric acid ($H_2SO_4$), hydrogen chloride (HCl), hydrogen bromide (HBr), ammonia ($NH_3$), phosphoric acid ($H_3PO_4$), and other suitable assistive etch chemicals and combinations thereof as well as solvents such as deionized water, alcohol, acetone, and other suitable solvents and combinations thereof to control the above-described etching rates.

When the gate spacer includes multiple layers (e.g., 1120 of FIG. 11B, 1130 of FIG. 11C), after the etching process 1201, the gate spacer can include a first one of its layers having one sidewall exposed in the gate trench and one or more second ones of its layers having an L-shaped profile. Specifically, the L-shaped second layer includes a vertical portion and a horizontal portion, wherein the vertical portion is separated from the gate trench by the first layer and the horizontal portion has one of its sidewalls exposed in the gate trench.

For example in FIG. 12 where the gate spacer 1120 includes two layers, after the etching process 1201, the layer 1124 has one sidewall exposed in the gate trenches 1000A-B, and the other sidewall contacting one of the sidewalls of a vertical portion 1122V of the layer 1122. Further, the layer 1122 includes a horizontal portion 1122H, connected to the vertical portion 1122V, that has one sidewall exposed in the gate trenches 1000A-B and the other sidewall contacting the ILD 920. In another example where a gate spacer includes three layers (e.g., the gate spacer 1130 of FIG. 11C), after the etching process 1201, the layer 1136 can have one sidewall exposed in the gate trenches 1000A-B, and the other sidewall contacting one of the sidewalls of a vertical portion of the layer 1134. Further, the layer 1134 can include a horizontal portion, connected to its vertical portion, that has one sidewall exposed in the gate trenches 1000A-B and the other sidewall contacting one of the sidewalls of a vertical portion of the layer 1132. Further, the layer 1132 can include a horizontal portion, connected to its vertical portion, that has one sidewall exposed in the gate trenches 1000A-B and the other sidewall contacting the ILD 920.

Alternatively or additionally, the L-shaped profile may be removed by the etching process 1201, in accordance with some embodiments. For example in FIG. 12, the layer 1124 and a portion of the horizontal portion 1122H below the layer 1124 may be removed during the etching process 1201. As such, the gate spacer 1120 may only include the layer 1122 remained. In such cases, a critical dimension of the gate trenches 1000A-B may be enlarged, which can in turn increase the critical dimension of active gate structures that will later fill the gate trenches 1000A-B.

The remaining portions of the ESLs 630A-B each have a sidewall that is vertically aligned with a sidewall collectively formed by the one or more layers (e.g., 1122 and 1124) of the gate spacer 1120. These two vertically aligned sidewalls are exposed in the gate trenches 1000A-B. As such, the ESLs 630A-B and the gate spacer 1120 may share a critical dimension, $CD_1$, measured between their respective sidewalls along the Y direction. Also, the inner spacers 710A-B can each have a critical dimension, $CD_2$, measured between their respective sidewalls along the Y direction. In the illustrated example of FIG. 12, $CD_1$ is about equal to $CD_2$. It should be understood that $CD_1$ can be greater or less than $CD_2$, while remaining within the scope of the present disclosure. In some other embodiments, a portion of the exposed sidewall of the gate spacer 1120 and/or the exposed sidewall of the ESLs 630A-B may not be formed as a vertical sidewall, which will be discussed as follows.

Figure 13A:
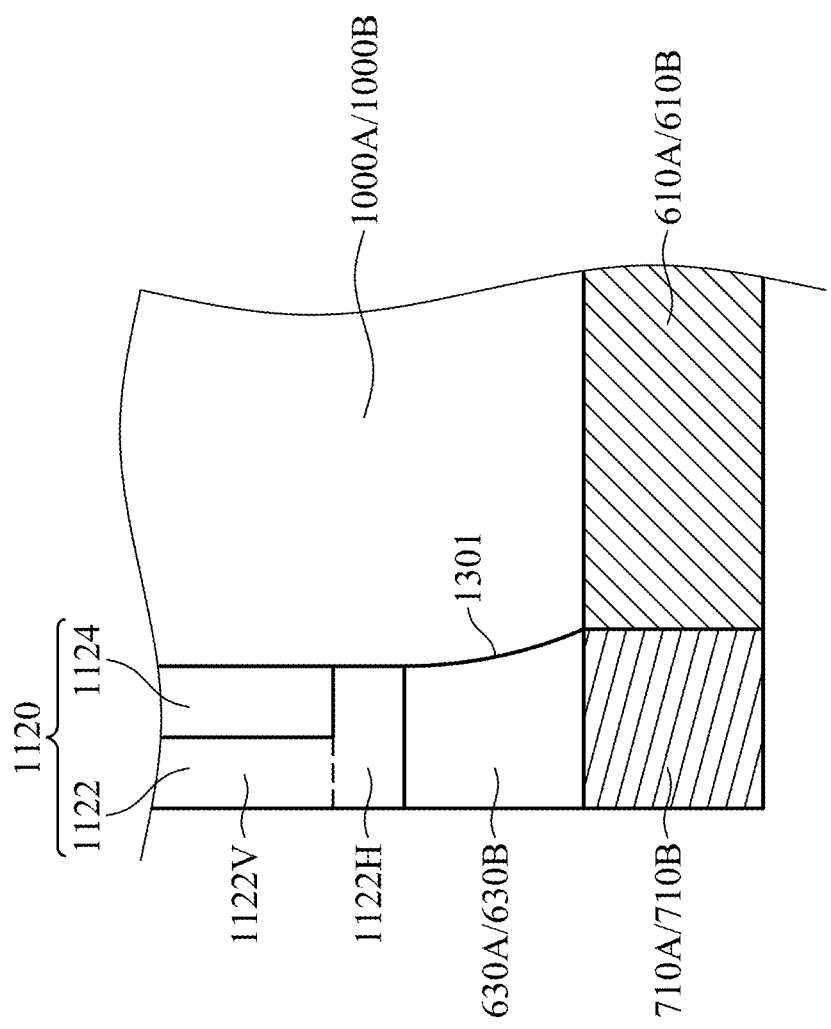
Figure 13B:
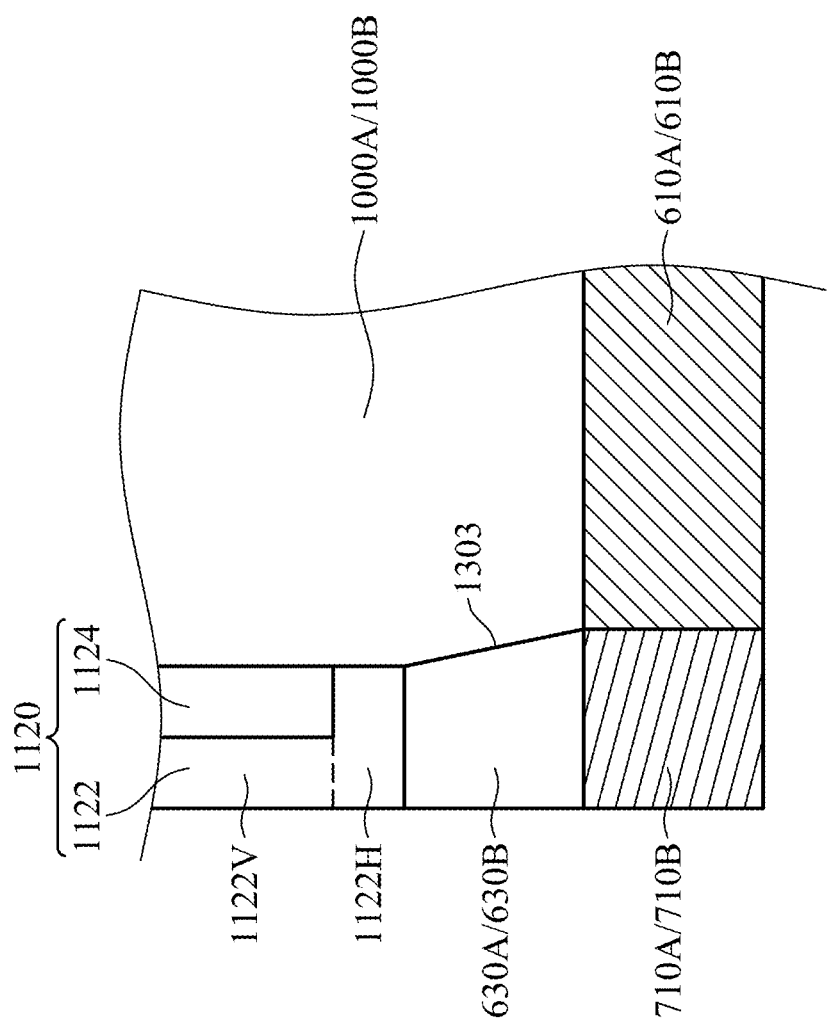

FIGS. 13A, 13B, 13C, and 13D respectively illustrate different profiles of the gate spacer 1120 and ESLs 630A/B, formed by the etching process 1201 (FIG. 12), in enlarged views. As shown in FIG. 13A, the layers 1122 and 1124 of the gate spacer 1120 collectively present a vertical sidewall exposed in the gate trench 1000A/B (e.g., forming an angle about 90° between the top surface of the exposed semiconductor layer 610A), while a sidewall of the ESLs 630A/B, extending from the vertical sidewall, presents a curvature-based profile exposed in the gate trench 1000A/B (e.g., sidewall 1301 as indicated). Specifically, the horizontal portion 1122H of the layer 1122 presents one of its sidewall exposed in the gate trenches 1000A/B as a portion of the vertical sidewall. As shown in FIG. 13B, the layers 1122 and 1124 of the gate spacer 1120 collectively present a vertical sidewall exposed in the gate trench 1000A/B (e.g., forming an angle about 90° between the top surface of the exposed semiconductor layer 610A), while a sidewall of the ESLs 630A/B, extending from the vertical sidewall, presents an edge-based profile exposed in the gate trench 1000A/B (e.g., sidewall 1303 as indicated). Specifically, the horizontal portion 1122H of the layer 1122 presents one of its sidewall exposed in the gate trenches 1000A/B as a portion of the vertical sidewall.

Figure 13C:
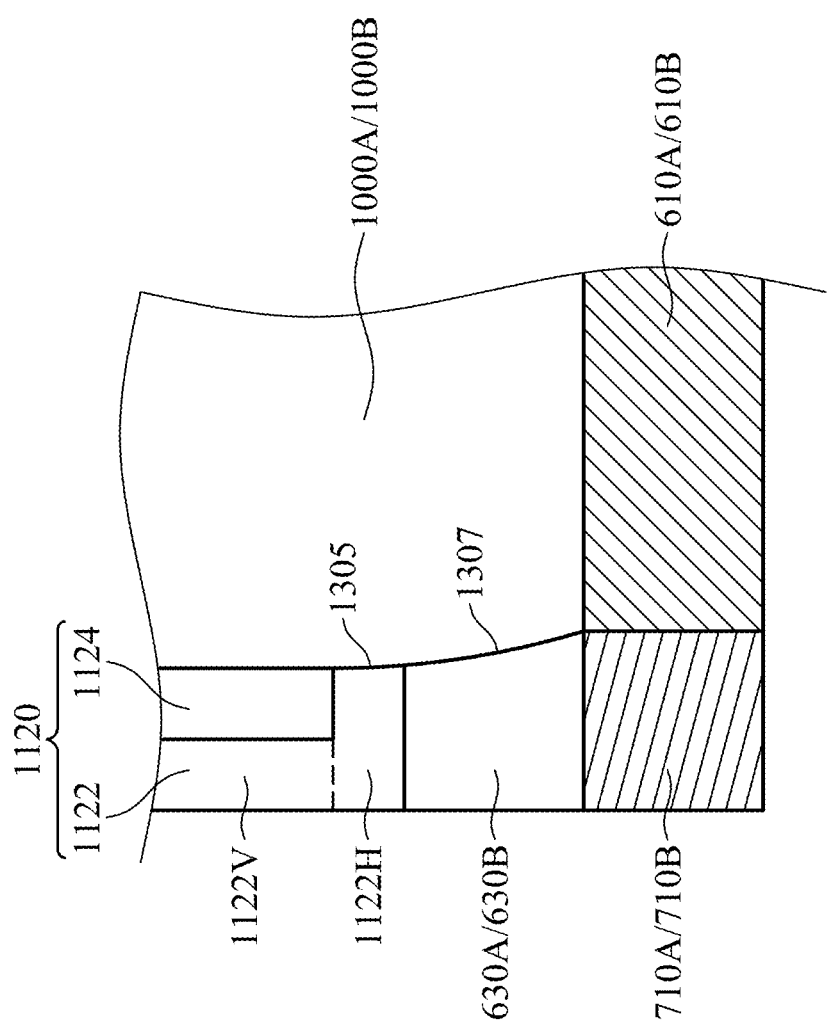
Figure 13D:
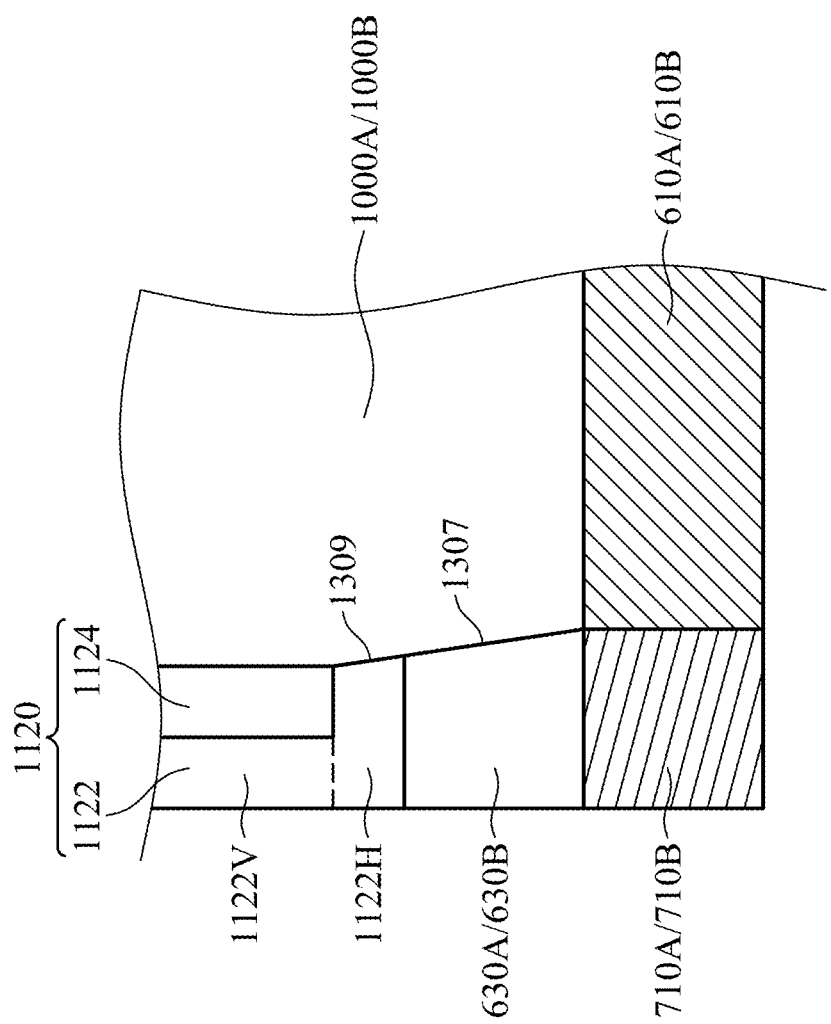

As shown in FIG. 13C, the layer 1124 of the gate spacer 1120 presents a vertical sidewall exposed in the gate trench 1000A/B (e.g., forming an angle about 90° between the top surface of the exposed semiconductor layer 610A), while a sidewall of the layer 1122 and a sidewall of the ESLs 630A/B collectively present a curvature-based profile exposed in the gate trench 1000A/B (e.g., sidewalls 1305 and 1307 as indicated). Specifically, the horizontal portion 1122H of the layer 1122 presents one of its sidewall, 1305, exposed in the gate trenches 1000A/B as a portion of the curvature-based profile. Such a gate spacer may sometimes be referred to as having a curvature-based footing protruding from the vertical sidewall. As shown in FIG. 13D, the layer 1124 of the gate spacer 1120 presents a vertical sidewall exposed in the gate trench 1000A/B (e.g., forming an angle about 90° between the top surface of the exposed semiconductor layer 610A), while a sidewall of the layer 1122 and a sidewall of the ESLs 630A/B collectively present an edge-based profile exposed in the gate trench 1000A/B (e.g., sidewalls 1309 and 1311 as indicated). Specifically, the horizontal portion 1122H of the layer 1122 presents one of its sidewall, 1309, exposed in the gate trenches 1000A/B as a portion of the edge-based profile. Such a gate spacer may sometimes be referred to as having an edge-based footing protruding from the vertical sidewall.

The example gate spacer shown in FIGS. 13C-D includes two layers, which results in at least one of the two layers having either a curvature-based or an edge-based footing, but it should be understood that the disclosed gate spacer, regardless of how many layers being included, can have one or more of its layers presenting either a curvature-based or an edge-based footing, while remaining within the scope of the present disclosure. For example, when a gate spacer includes one layer (e.g., the gate spacer 1110 of FIG. 11A), after the etching process 1201, the gate spacer 1110 can have either a curvature-based or an edge-based footing protruding toward the gate trench 1000A/B. In another example, when a gate spacer includes three layers (e.g., the gate spacer 1130 of FIG. 11C), after the etching process 1201, one or more layers of the gate spacer 1130 (e.g., the layers 1132, 1134, and/or 1136) can have either a curvature-based or an edge-based footing protruding toward the gate trench 1000A/B.

Figure 14:
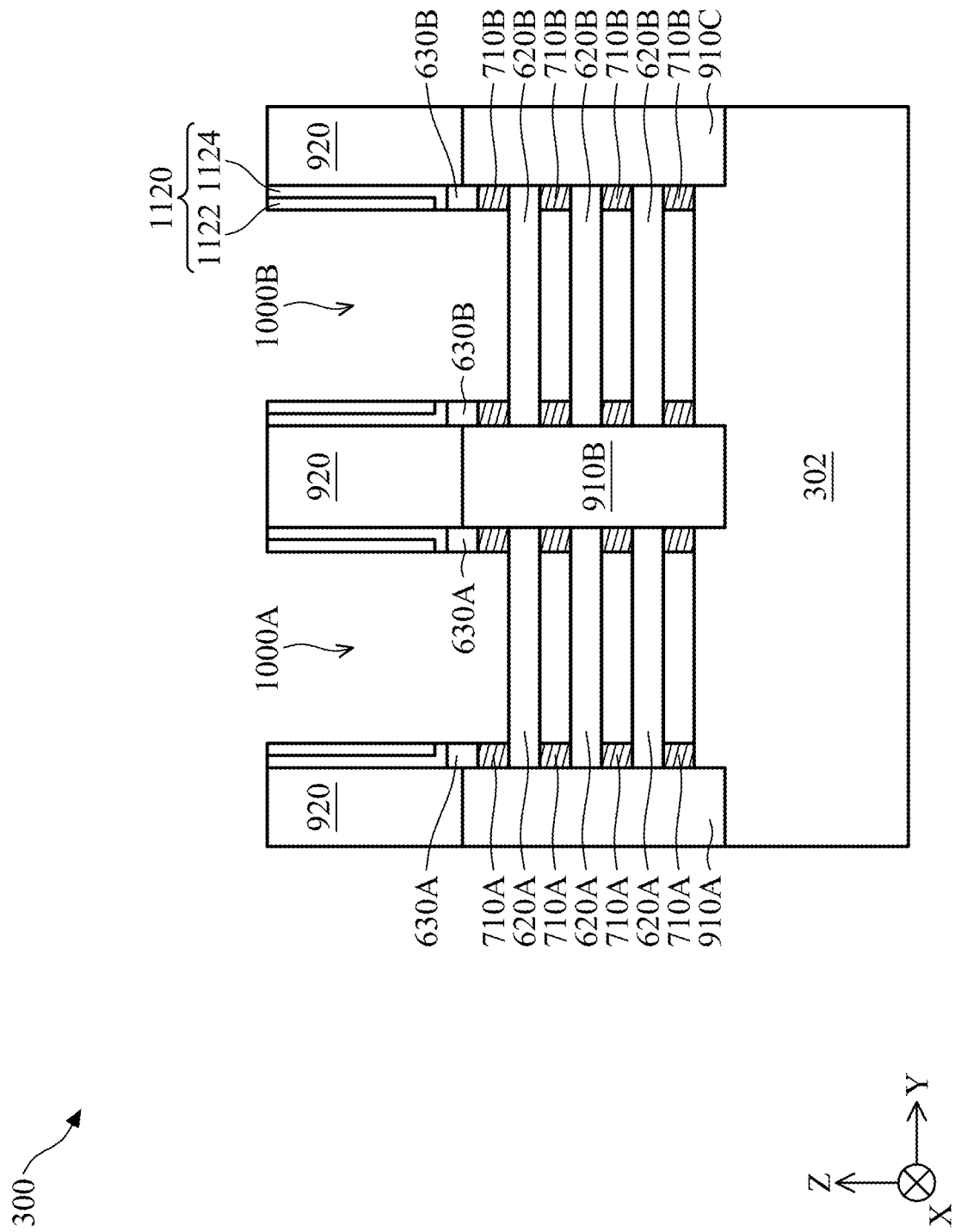

Corresponding to operation 220 of FIG. 2, FIG. 14 is a cross-sectional view of the GAA FET device 300 in which the semiconductor layers 610A-B are removed, at one of the various stages of fabrication. The cross-sectional view of FIG. 14 is cut in a direction perpendicular to the lengthwise direction of an active/dummy gate structure of the GAA FET device 300 (e.g., cross-section B-B indicated in FIG. 1).

Subsequently to exposing the topmost semiconductor layers 610A-B (referring again to FIG. 12), the semiconductor layers 610A-B are removed by applying a selective etch (e.g., a hydrochloric acid (HCl)), while leaving the semiconductor layers 620A-B substantially intact. After the removal of the semiconductor layers 610A-B, respective bottom surface and/or top surface of each of the semiconductor layers 620A-B may be exposed by the "extended" gate trenches 1000A-B, in accordance with various embodiments. For example, upon removing the semiconductor layers 610A-B, the gate trenches 1000A-B can be further extended from a region that is above the topmost semiconductor layers 610A-B to a region that is below the topmost semiconductor layers 610A-B. Consequently, the bottom surface of each of the topmost semiconductor layers 620A-B can be exposed, and the respective top and bottom surfaces of each of the rest of the semiconductor layers 620A-B can also be exposed.

Figure 15:
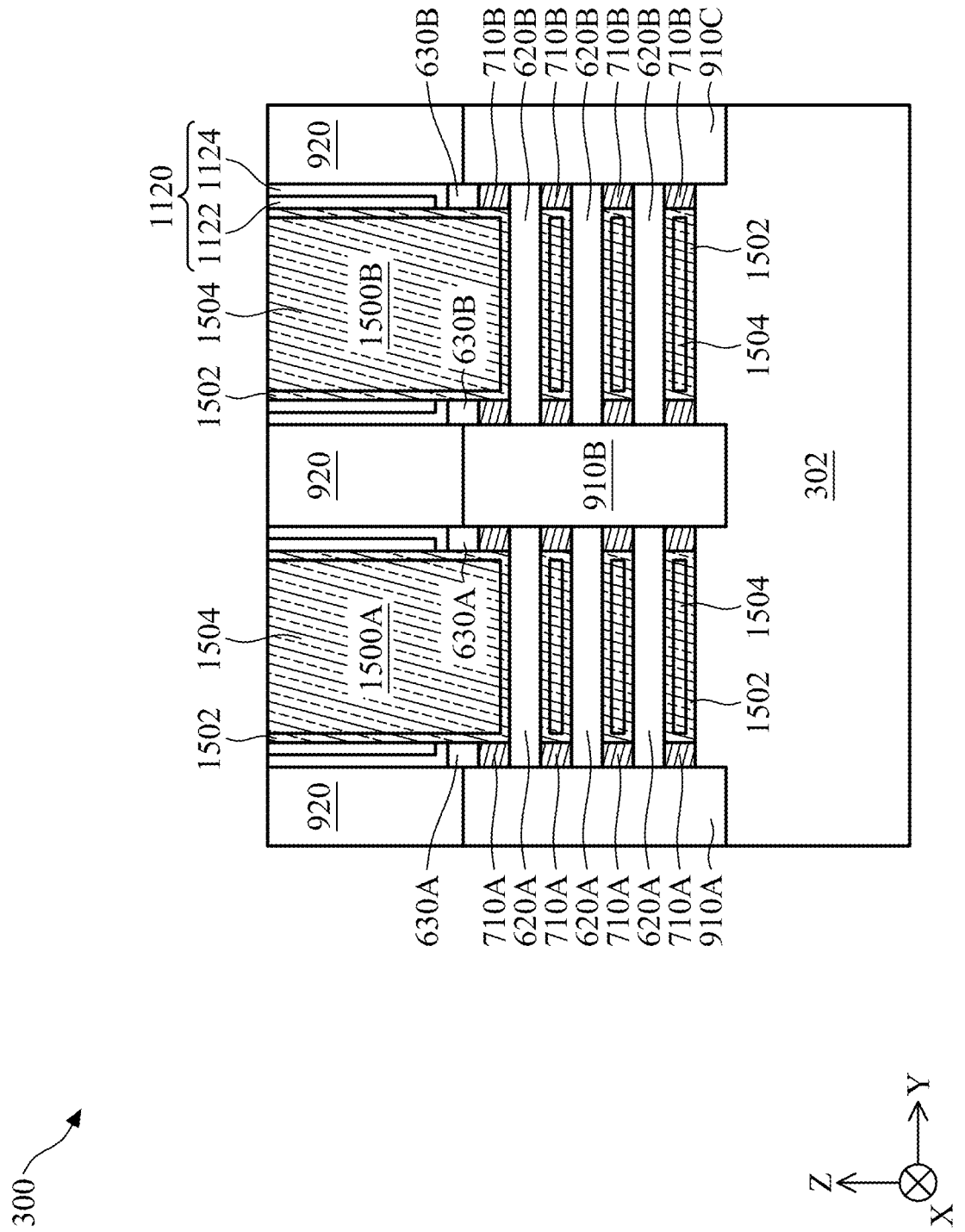

Corresponding to operation 222 of FIG. 2, FIG. 15 is a cross-sectional view of the GAA FET device 300 including active gate structures 1500A and 1500B, at one of the various stages of fabrication. The cross-sectional view of FIG. 15 is cut in a direction perpendicular to the lengthwise direction of an active/dummy gate structure of the GAA FET device 300 (e.g., cross-section B-B indicated in FIG. 1).

The active gate structures 1500A-B are formed in the extended gate trenches 1000A-B (FIG. 14) by filling a gate dielectric and a gate metal, while leaving other components (e.g., the gate spacer 1120) substantially intact, and thus, the active gate structures 1500A-B can inherit the dimensions and profiles of the gate trenches 1000A-B, respectively. For example in FIG. 15, the active gate structures 1500A-B can each include an upper portion and a lower portion that may be separated by the ESL 630A/B (if still present). The upper portion may be surrounded by the gate spacer 1120, and the lower portion may wrap around each of the semiconductor layers 620A/B. The gate spacer 1120 can include at least one layer (e.g., 1122) presenting an L-shaped profile that has a horizontal portion protruding toward the active gate structure (and away from the ILD 920), in some embodiments. Specifically, the layer 1124 of the gate spacer 1120 has one sidewall contacting a first portion of the sidewall of the upper portion of the active gate structure 1500A/B, and the other sidewall contacting one of the sidewalls of a vertical portion of the layer 1122. Further, the layer 1122 includes a horizontal portion, connected to the vertical portion, that has one sidewall contacting a second portion of the sidewall of the active gate structure 1500A/B and the other sidewall contacting the ILD 920.

Each of the active gate structures 1500A-B includes a gate dielectric and a gate metal, in some embodiments. For example in FIG. 15, each of the active gate structures 1500A-B includes a gate dielectric 1502 and a gate metal 1504. Although the gate dielectric 1502 and gate metal 1504 are each shown as a single layer, it should be understood that the gate dielectric 1502 and gate metal 1504 can each be formed as a multi-layer stack, while remaining within the scope of the present disclosure.

The gate dielectric 1502 can wrap around each of the semiconductor layers 620A-B, e.g., the top and bottom surfaces and sidewalls facing the X direction). The gate dielectric 1502 may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric 1502 may include a stack of multiple high-k dielectric materials. The gate dielectric 1502 can be deposited using any suitable method, including, for example, molecular beam deposition (MBD), atomic layer deposition (ALD), PECVD, and the like. In some embodiments, the gate dielectric 1502 may optionally include a substantially thin oxide (e.g., $SiO_x$) layer, which may be a native oxide layer formed on the surface of each of the semiconductor layers 620A-B.

The gate metal 1504 can wrap around each of the semiconductor layers 620A-B with the gate dielectric 1502 disposed therebetween. Specifically, the gate metal 1504 can include a number of gate metal sections abutted to each other along the Z direction. Each of the gate metal sections can extend not only along a horizontal plane (e.g., the plane expanded by the X direction and the Y direction), but also along a vertical direction (e.g., the Z direction). As such, two adjacent ones of the gate metal sections can adjoin together to wrap around a corresponding one of the semiconductor layers 620A-B, with the gate dielectric 1502 disposed therebetween.

The gate metal 1504 may include a stack of multiple metal materials. For example, the gate metal 1504 may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage VI is achieved in the device that is to be formed. The work function layer(s) may be deposited by CVD, physical vapor deposition (PVD), ALD, and/or other suitable process.

Figure 16:
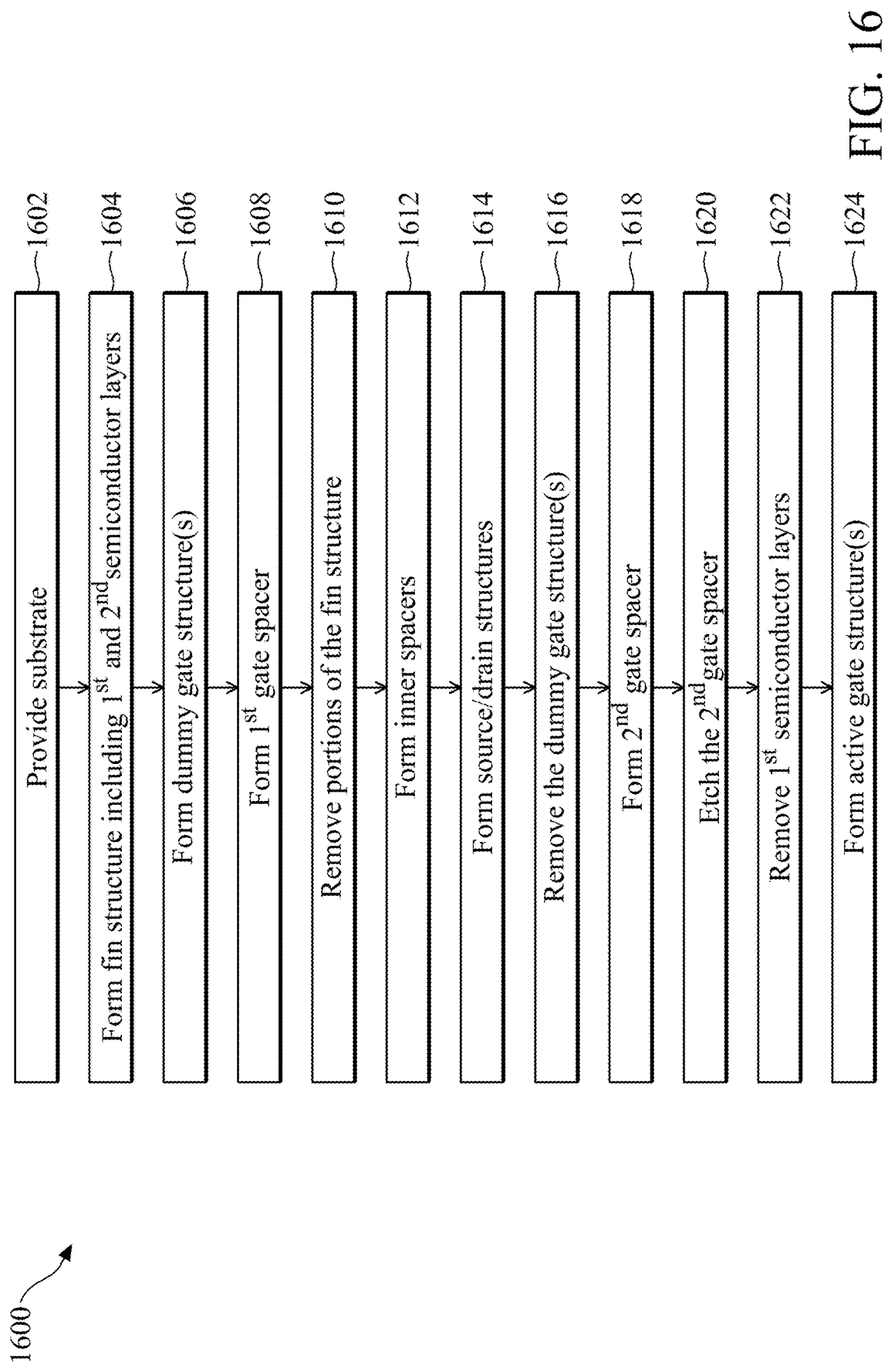
FIG. 16 illustrates a flow chart of another example method for making a non-planar transistor device, in accordance with some embodiments.

FIG. 16 illustrates a flowchart of a method 1600 to form a non-planar transistor device, according to one or more embodiments of the present disclosure. For example, at least some of the operations (or steps) of the method 1600 can be used to form a FinFET device, a GAA FET device (e.g., GAA FET device 100), a nanosheet transistor device, a nanowire transistor device, a vertical transistor device, a gate-all-around (GAA) transistor device, or the like. It is noted that the method 1600 is merely an example, and is not intended to limit the present disclosure. Accordingly, it is understood that additional operations may be provided before, during, and after the method 1600 of FIG. 16, and that some other operations may only be briefly described herein.

In some embodiments, some operations of the method 1600 are similar to the operations of the method 200 (FIG. 2), and thus, the following discussions will be focused on the differences. For example, the method 1600 starts with operation 1602 of providing a substrate. The method 1600 continues to operation 1604 of forming a fin structure including a number of first semiconductor layers and a number of second semiconductor layers. The method 1600 continues to operation 1606 of forming one or more dummy gate structures. Different from the method 200, the method 1600 next continues to operation 1608 of forming a first gate spacer around the dummy gate structure. The method 1600 then continues to operation 1610 of removing portions of the fin structure, to operation 1612 of forming inner spacers, and then to operation 1614 of forming source/drain structures. Next, in operation 1616, the one or more dummy gate structures are removed. The method 1600 continues to operation 1618 of forming a second gate spacer. The method 1600 continues to operation 1620 of etching the second gate spacer. The method 1600 continues to operation 1622 of removing the first semiconductor layers. The method 1600 continues to operation 1624 of forming one or more active gate structures.

By using the method 1600 to form a GAA FET device, the GAA FET device can have a first gate spacer and a second gate spacer, in which the first gate spacer (when including multiple layers) can present an L-shaped profile protruding away from an active gate structure and toward an ILD, and the second gate spacer (when including multiple layers) can also present an L-shaped profile protruding toward an active gate structure and away from an ILD. FIGS. 17A, 17B, 17C, and 17D respectively illustrate enlarged, cross-sectional views of different profiles of a first and second gate spacers around the upper portion of an active gate structure 1701, formed by the method 1600 of FIG. 16, in accordance with various embodiments. It should be appreciated that the enlarged views of FIGS. 17A-D merely represent a portion of a GAA FET 1700, which includes various other components (e.g., a substrate, source/drain structures, semiconductor layers as a channel, etc.) that are not shown for clarity.

Figure 17A:
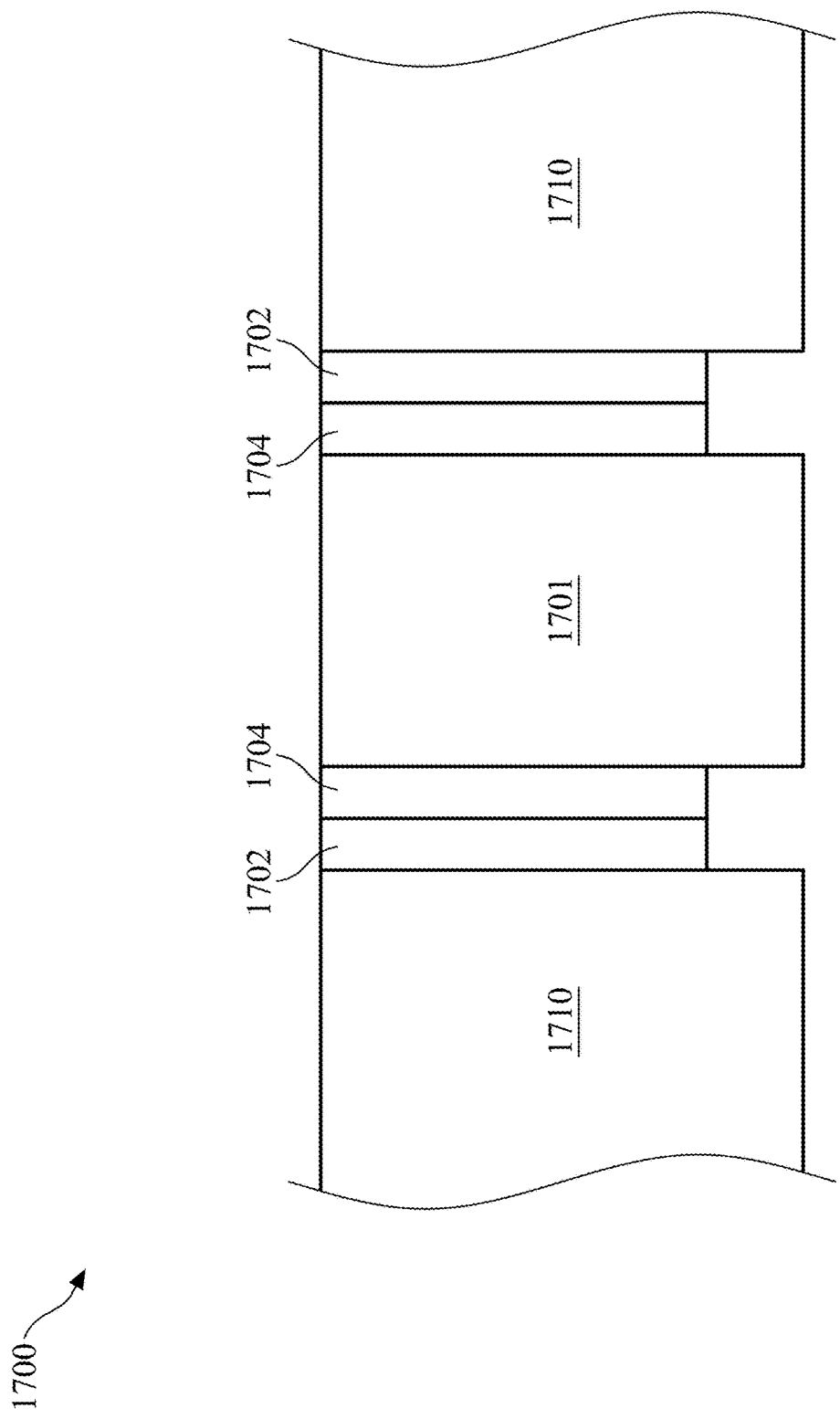
FIGS. 17A, 17B, 17C, and 17D respectively illustrate enlarged, cross-sectional views of different profiles of multiple gate spacers, formed by the method of FIG. 16, in accordance with some embodiments.

Referring first to FIG. 17A, the GAA FET device 1700 includes a first gate spacer 1702 (e.g., formed by operation 1608) and a second gate spacer 1704 (e.g., formed by operations 1618 and 1620), both of which extend along a sidewall of an upper portion of the active gate structure 1701. Further, the GAA FET device 1700 includes an ILD 1710 extends along each of the sidewall of the upper portion of the active gate structure 1701, with the gate spacers 1702 and 1704 sandwiched therebetween. In the example of FIG. 17A, each of the gate spacers 1702 and 1704 includes a single layer, and thus, the gate spacers 1702 and 1704 may each present a vertical profile.

In some embodiments, the first gate spacer 1702 may include a low-k spacer and may be formed of a suitable dielectric material, such as silicon oxide, silicon oxycarbonitride, or the like. The second gate spacer 1704 may include a dielectric material selected from the group consisting of: silicon nitride, silicon oxynitride, silicon carbonitride, silicon carbide, silicon oxycarbide, the like, or combinations thereof. The first gate spacer 1702 and second gate spacer 1704 may be respectively formed using atomic layer deposition (ALD), low-pressure chemical vapor deposition (LPCVD) or plasma enhanced chemical vapor deposition (PECVD), for example.

Figure 17B:
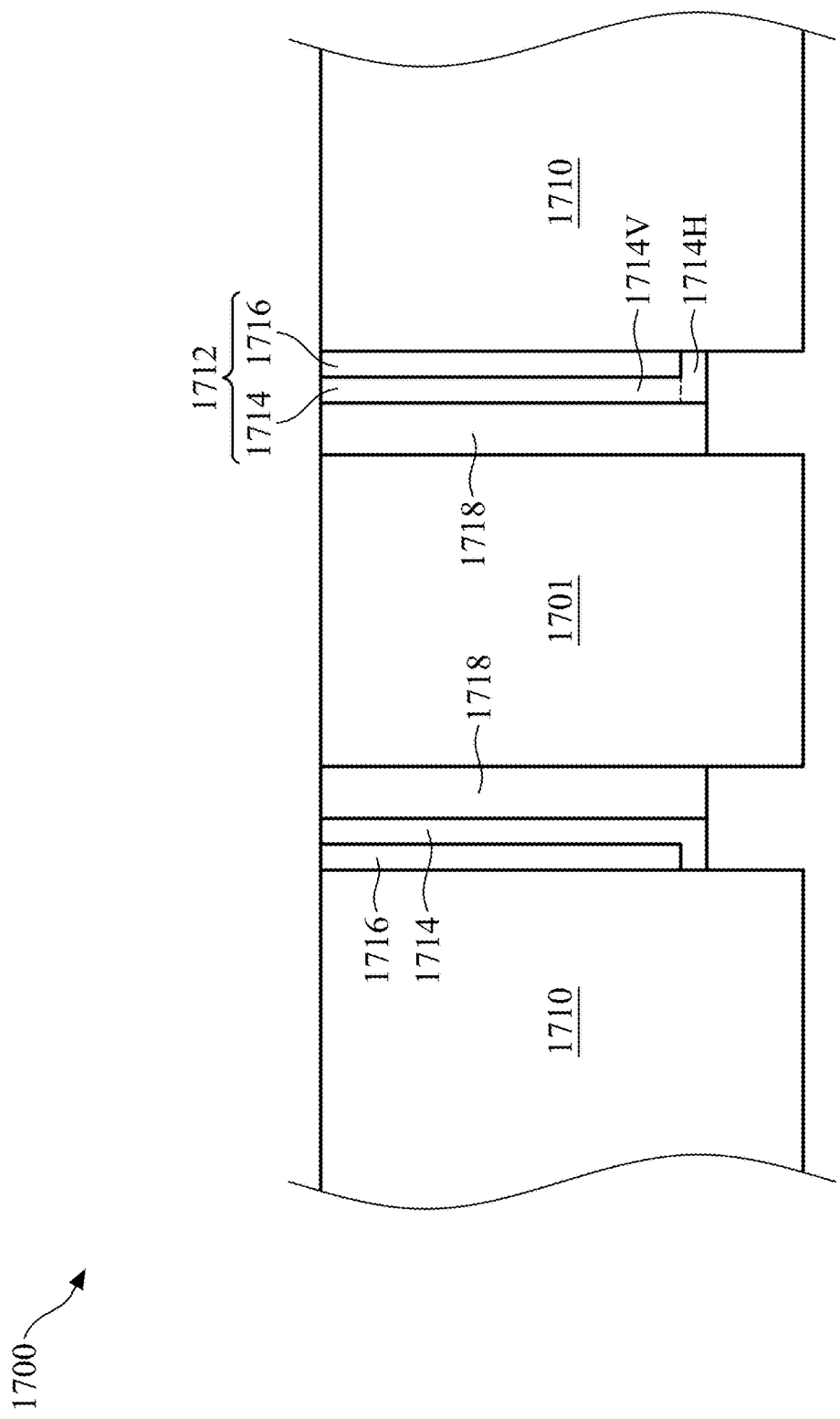

Referring next to FIG. 17B, the GAA FET device 1700 includes a first gate spacer 1712 (e.g., formed by operation 1608) and a second gate spacer 1718 (e.g., formed by operations 1618 and 1620), both of which extend along a sidewall of an upper portion of the active gate structure 1701. The ILD 1710 extends along each of the sidewall of the upper portion of the active gate structure 1701, with the gate spacers 1712 and 1718 sandwiched therebetween. In the example of FIG. 17B, the first gate spacer 1712 include multiple layers (e.g., 1714 and 1716), and the second gate spacer 1718 includes a single layer. As such, the layer 1714 of the first gate spacer 1712 may present an L-shaped profile, while the layer 1716 of the first gate spacer 1712 and the second gate spacer 1718 may each present a vertical profile. The L-shaped profile may have a horizontal portion protruding away from the active gate structure 1701 and toward the ILD 1710.

Specifically, the second gate spacer 1718 has one sidewall contacting a sidewall of the upper portion of the active gate structure 1701, and the other sidewall contacting one of the sidewalls of a vertical portion (1714V) of the layer 1714 of the first gate spacer 1712. The other sidewall of the vertical portion 1714V may contact the layer 1716. Further, the layer 1714 includes a horizontal portion (1714H), connected to the vertical portion, that has one sidewall contacting the second gate spacer 1718 and the other sidewall contacting the ILD 1710. It should be understood that the first gate spacer 1712 can include any number of layer that is greater than 2, while remaining within the scope of the present disclosure. As such, one or more of the layers of the first gate spacer 1712 can present an L-shaped profile. For example, when the gate spacer 1712 has three layers, the gate spacer 1712 may further include an L-shaped layer between the layers 1714 and 1716 shown in FIG. 17B.

In some embodiments, each of the layers of the first gate spacer 1712 may include a low-k spacer and may be formed of a suitable dielectric material, such as silicon oxide, silicon oxycarbonitride, or the like. The second gate spacer 1718 may include a dielectric material selected from the group consisting of: silicon nitride, silicon oxynitride, silicon carbonitride, silicon carbide, silicon oxycarbide, the like, or combinations thereof. The first gate spacer 1712 and second gate spacer 1718 may be respectively formed using atomic layer deposition (ALD), low-pressure chemical vapor deposition (LPCVD) or plasma enhanced chemical vapor deposition (PECVD), for example.

Figure 17C:
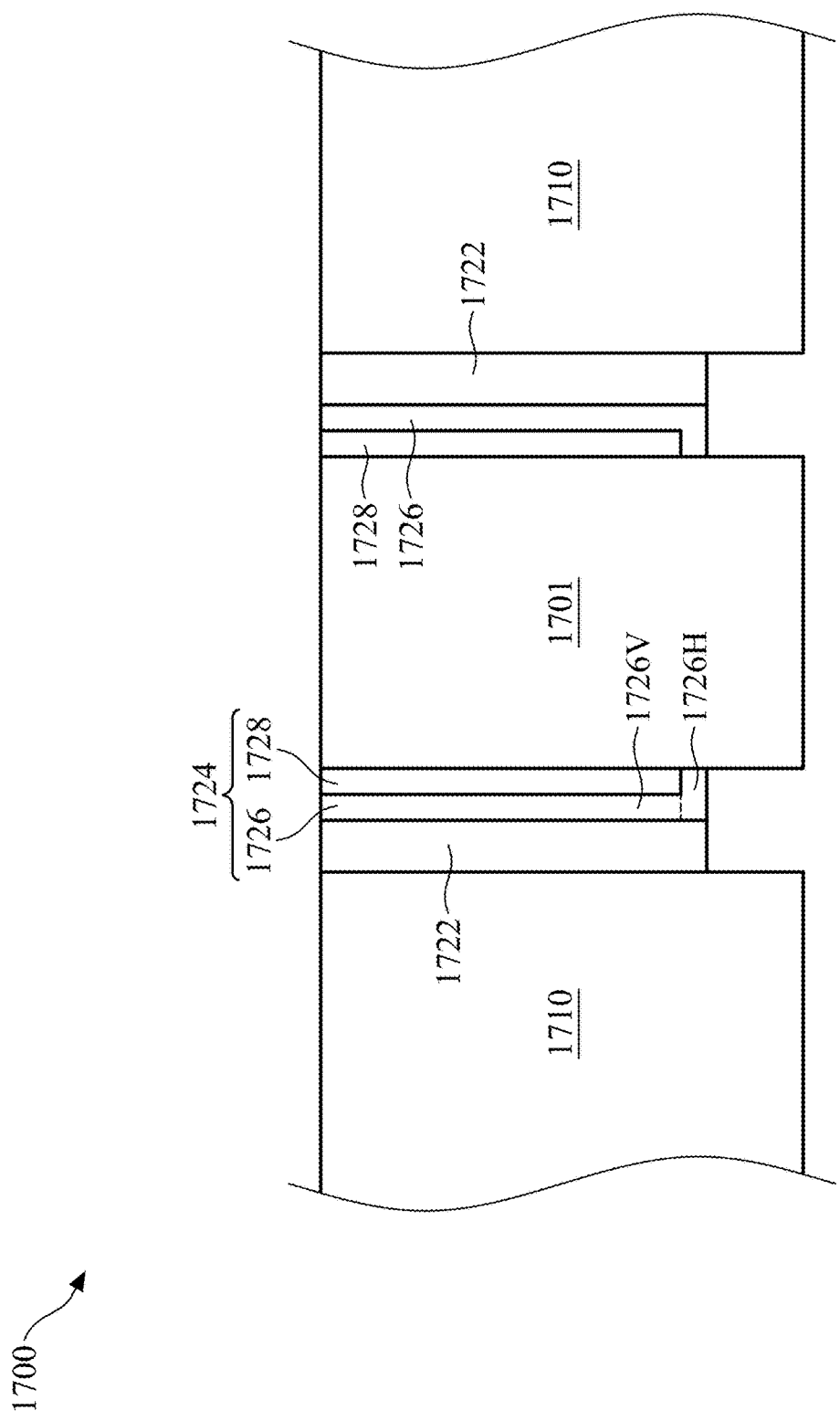

Referring next to FIG. 17C, the GAA FET device 1700 includes a first gate spacer 1722 (e.g., formed by operation 1608) and a second gate spacer 1724 (e.g., formed by operations 1618 and 1620), both of which extend along a sidewall of an upper portion of the active gate structure 1701. The ILD 1710 extends along each of the sidewall of the upper portion of the active gate structure 1701, with the gate spacers 1722 and 1724 sandwiched therebetween. In the example of FIG. 17C, the second gate spacer 1724 include multiple layers (e.g., 1726 and 1728), and the first gate spacer 1722 includes a single layer. As such, the layer 1726 of the second gate spacer 1724 may present an L-shaped profile, while the layer 1728 of the second gate spacer 1724 and the first gate spacer 1722 may each present a vertical profile. The L-shaped profile may have a horizontal portion protruding toward the active gate structure 1701 and away from the ILD 1710.

Specifically, the layer 1728 of the second gate spacer 1724 has one sidewall contacting a first portion of the sidewall of the upper portion of the active gate structure 1701, and the other sidewall contacting one of the sidewalls of a vertical portion (1726V) of the layer 1726. Further, the layer 1726 includes a horizontal portion (1726H), connected to the vertical portion, that has one sidewall contacting a second portion of the sidewall of the upper portion of the active gate structure 1701 and the other sidewall contacting the first gate spacer 1722. It should be understood that the second gate spacer 1724 can include any number of layer that is greater than 2, while remaining within the scope of the present disclosure. As such, one or more of the layers of the second gate spacer 1724 can present an L-shaped profile. For example, when the gate spacer 1724 has three layers, the gate spacer 1724 may further include an L-shaped layer between the layers 1726 and 1728 shown in FIG. 17C.

In some embodiments, the first gate spacer 1722 may include a low-k spacer and may be formed of a suitable dielectric material, such as silicon oxide, silicon oxycarbonitride, or the like. Each of the layers of the second gate spacer 1724 may include a dielectric material selected from the group consisting of: silicon nitride, silicon oxynitride, silicon carbonitride, silicon carbide, silicon oxycarbide, the like, or combinations thereof. The first gate spacer 1722 and second gate spacer 1724 may be respectively formed using atomic layer deposition (ALD), low-pressure chemical vapor deposition (LPCVD) or plasma enhanced chemical vapor deposition (PECVD), for example.

Figure 17D:
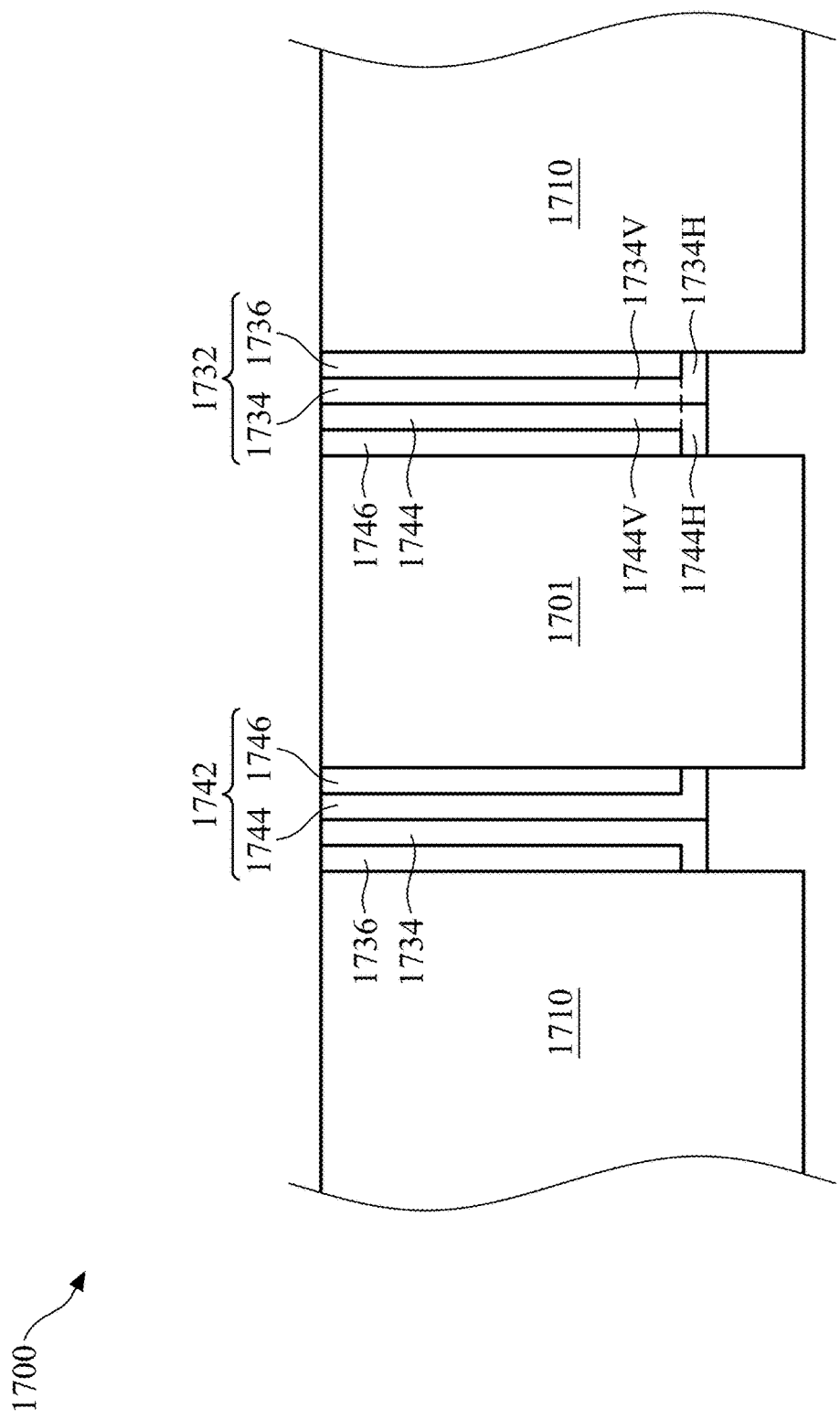

Referring then to FIG. 17D, the GAA FET device 1700 includes a first gate spacer 1732 (e.g., formed by operation 1608) and a second gate spacer 1742 (e.g., formed by operations 1618 and 1620), both of which extend along a sidewall of an upper portion of the active gate structure 1701. The ILD 1710 extends along each of the sidewall of the upper portion of the active gate structure 1701, with the gate spacers 1732 and 1742 sandwiched therebetween. In the example of FIG. 17D, both the first gate spacer 1732 and the second gate spacer 1744 include multiple layers (e.g., 1734 and 1736, 1744 and 1746, respectively). As such, the layer 1734 of the first gate spacer 1732 may present an L-shaped profile, while the layer 1736 of the first gate spacer 1732 may present a vertical profile; and the layer 1744 of the second gate spacer 1742 may present an L-shaped profile, while the layer 1746 of the second gate spacer 1742 may present a vertical profile. The L-shaped profile of the first gate spacer 1732 may have a horizontal portion protruding away from the active gate structure 1701 and toward the ILD 1710; and the L-shaped profile of the second gate spacer 1742 may have a horizontal portion protruding toward the active gate structure 1701 and away from the ILD 1710.

Specifically, the layer 1746 of the second gate spacer 1742 has one sidewall contacting a first portion of a sidewall of the upper portion of the active gate structure 1701, and the other sidewall contacting one of the sidewalls of a vertical portion (1744V) of the layer 1744 of the second gate spacer 1742. The other sidewall of the vertical portion 1744V may contact a vertical portion (1734V) of the layer 1734 of the first gate spacer 1732. Further, the layer 1744 of the second gate spacer 1742 includes a horizontal portion (1744H), connected to the vertical portion 1744V, that has one sidewall contacting a second portion of the sidewall of the upper portion of the active gate structure 1701 and the other sidewall contacting the layer 1734 of the first gate spacer 1732. Still further, the layer 1734 of the first gate spacer 1732 includes a horizontal portion (1734H), connected to the vertical portion 1734V, that has one sidewall contacting the layer 1744 of the first gate spacer and the other sidewall contacting the ILD 1710. It should be understood that the first gate spacer 1732 and second gate spacer 1742 can each include any number of layer that is greater than 2, while remaining within the scope of the present disclosure. As such, one or more of the layers of the first gate spacer 1732 can present an L-shaped profile, and one or more of the layers of the second gate spacer 1742 can present an L-shaped profile.

In some embodiments, each of the layers of the first gate spacer 1732 may include a low-k spacer and may be formed of a suitable dielectric material, such as silicon oxide, silicon oxycarbonitride, or the like. Each of the layers of the second gate spacer 1742 may include a dielectric material selected from the group consisting of: silicon nitride, silicon oxynitride, silicon carbonitride, silicon carbide, silicon oxycarbide, the like, or combinations thereof. The first gate spacer 1732 and second gate spacer 1742 may be respectively formed using atomic layer deposition (ALD), low-pressure chemical vapor deposition (LPCVD) or plasma enhanced chemical vapor deposition (PECVD), for example.

In one aspect of the present disclosure, a semiconductor device is disclosed. The semiconductor device includes a plurality of semiconductor layers vertically separated from one another. The semiconductor device includes a gate structure that comprises a lower portion and an upper portion. The lower portion wraps around each of the plurality of semiconductor layers. The semiconductor device includes a gate spacer that extends along a sidewall of the upper portion of the gate structure and comprises a first layer and a second layer. The first layer is in contact with a first portion of the sidewall and the second layer is in contact with a second portion of the sidewall.

In another aspect of the present disclosure, a semiconductor device is disclosed. The semiconductor device includes a fin structure disposed over a substrate. The semiconductor device includes a gate structure that comprises a lower portion and an upper portion. The lower portion straddles the fin structure. The semiconductor device includes a gate spacer that extends along a sidewall of the upper portion of the gate structure and comprises a first layer and a second layer. The first layer has a vertical portion that is in contact with and extends along the sidewall. The second layer includes a vertical portion that extends along the sidewall and is separated from the sidewall by the first layer, and a horizontal portion that is in contact with the sidewall.

In yet another aspect of the present disclosure, a method for fabricating a semiconductor device is disclosed. The method includes forming a fin structure extending along a first lateral direction. The method includes forming a dummy gate structure over a portion of the fin structure. The dummy gate structure extends along a second direction perpendicular to the first lateral direction. The method includes growing source/drain structures that are respectively coupled to ends of the portion of the fin structure. The method includes removing the dummy gate structure to form a gate trench. The method includes lining inner sidewalls of the gate trench with a gate spacer. The method includes forming an active gate structure in the gate trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
    forming a fin structure extending along a first lateral direction;
    forming a dummy gate structure over a portion of the fin structure, wherein the dummy gate structure extends along a second direction perpendicular to the first lateral direction;
    growing source/drain structures that are respectively coupled to ends of the portion of the fin structure;
    removing the dummy gate structure to form a gate trench;
    lining inner sidewalls of the gate trench with a gate spacer;
    etching the gate spacer to expose the fin structure; and
    forming an active gate structure over the etched gate spacer in the gate trench.

2. The method of claim 1, wherein the fin structure is formed to include a plurality of semiconductor layers, and wherein the active gate structure is formed to wrap around each of the plurality of semiconductor layers.

3. The method of claim 1, wherein the dummy gate structure is formed to include a dielectric material unfavorable to grow the source/drain structure.

4. The method of claim 1, wherein the gate spacer is formed to extend along a sidewall of an upper portion of the active gate structure and to comprise a first layer having a rectangular profile and a second layer having an L-shaped profile and in contact with the first layer.

5. The method of claim 4, wherein the first layer is formed in contact with a first portion of the sidewall and the second layer is formed in contact with a second portion of the sidewall.

6. The method of claim 5, wherein the second layer is formed to comprise a vertical portion that is separated from the sidewall by the first layer, and a horizontal portion that is in contact with the sidewall, and wherein an entire top surface of the horizontal portion is formed in contact with an entire bottom surface of the first layer.

7. The method of claim 5, wherein the second portion of the sidewall is formed to have a curvature-based profile.

8. The method of claim 5, wherein the second portion of the sidewall is formed to have an edge-based profile.

9. A method of manufacturing a semiconductor device, comprising:
    forming a gate structure comprising a lower portion and an upper portion, wherein the lower portion wraps around a plurality of fins; and
    forming a gate spacer to extend along a sidewall of the upper portion and to comprise a first layer and a second layer in contact with each other;
    wherein the first layer is formed to have a rectangular profile and to extend along the sidewall; and
    wherein the second layer is formed to be in an L-shaped profile and to comprise:
        a vertical portion separated from the sidewall by the first layer; and
        a horizontal portion having a top surface that is entirely in contact with an entire bottom surface of the first layer.

10. The method of claim 9, wherein the top surface of the horizontal portion is formed to separate the bottom surface of the first layer from the upper portion of the gate structure.

11. The method of claim 9, wherein an interface is formed between the sidewall and the first layer to vertically align with an interface between the sidewall and the second layer.

12. The method of claim 9, further comprising: forming an etch stop layer disposed between the upper portion and the lower portion of the gate structure.

13. The method of claim 12, wherein the etch stop layer is formed to have a top surface in contact with a bottom surface of the second layer of the gate spacer.

14. The method of claim 12, wherein the etch stop layer is formed to have a side surface that extends from the sidewall of the upper portion of the gate structure.

15. The method of claim 14, wherein the etch stop layer is formed to have a curvature-based profile.

16. The method of claim 14, wherein the etch stop layer is formed to have an edge-based profile.

17. A method of manufacturing a semiconductor device, comprising:
    forming a plurality of semiconductor layers vertically separated from one another;
    forming a gate structure to comprise a lower portion and an upper portion, wherein the lower portion is formed to wrap around each of the plurality of semiconductor layers; and
    forming a gate spacer to extend along a sidewall of the upper portion of the gate structure and to comprise a first layer having a rectangular profile and a second layer having an L-shaped profile and in contact with the first layer;

wherein the first layer is in contact with a first portion of the sidewall and the second layer is in contact with a second portion of the sidewall; and wherein the second layer is formed to comprise:
- a vertical portion separated from the sidewall by the first layer; and
- a horizontal portion in contact with the sidewall, an entire top surface of the horizontal portion being in contact with an entire bottom surface of the first layer.

18. The method of claim 17, wherein the gate spacer is formed to further comprise a third layer that is in contact with a third portion of the sidewall.

19. The method of claim 17, wherein the first portion of the sidewall is formed to vertically align with the second portion of the sidewall.

20. The method of claim 17, wherein the second portion of the sidewall is formed to be tilted away from the first portion of the sidewall toward the gate structure.

* * * * *